(12) United States Patent
Venugopal et al.

(10) Patent No.: US 9,793,214 B1
(45) Date of Patent: Oct. 17, 2017

(54) HETEROSTRUCTURE INTERCONNECTS FOR HIGH FREQUENCY APPLICATIONS

(71) Applicant: Texas Instruments Incorporated, Dallas, TX (US)

(72) Inventors: Archana Venugopal, Dallas, TX (US); Benjamin Stassen Cook, Rockwall, TX (US); Luigi Colombo, Dallas, TX (US); Robert Reid Doering, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/438,174

(22) Filed: Feb. 21, 2017

(51) Int. Cl.
| H01L 23/48 | (2006.01) |
| H01L 23/52 | (2006.01) |
| H01L 29/40 | (2006.01) |
| H01L 23/532 | (2006.01) |
| H01L 23/522 | (2006.01) |
| H01L 23/66 | (2006.01) |

(52) U.S. Cl.
CPC .... *H01L 23/53276* (2013.01); *H01L 23/5226* (2013.01); *H01L 23/53214* (2013.01); *H01L 23/53271* (2013.01); *H01L 23/66* (2013.01); H01L 2223/6616 (2013.01)

(58) Field of Classification Search
CPC .......... H01L 29/1606; H01L 21/02491; H01L 21/0254; H01L 29/78684
USPC ......... 257/750, 765, 771; 438/652, 666, 688
See application file for complete search history.

(56) References Cited

U.S. PATENT DOCUMENTS

| 7,619,257 | B2 | 11/2009 | Pfeiffer | |
| 7,927,978 | B2 | 4/2011 | Pfeiffer | |
| 8,159,037 | B2 | 4/2012 | Woo | |
| 8,513,653 | B2 * | 8/2013 | Woo | B82Y 10/00 257/40 |
| 8,952,356 | B2 | 2/2015 | Kim | |
| 9,029,228 | B2 | 5/2015 | Seacrist | |
| 9,082,523 | B2 | 7/2015 | Ozyilmaz | |
| 9,082,682 | B2 | 7/2015 | Kim | |
| 9,144,962 | B2 | 9/2015 | Lee | |
| 9,257,509 | B2 | 2/2016 | Shepard | |
| 9,281,385 | B2 | 3/2016 | Shin | |
| 9,287,116 | B2 | 3/2016 | Suh | |
| 9,299,473 | B2 | 3/2016 | Schmidt | |
| 9,318,591 | B2 | 4/2016 | Geim | |
| 9,331,198 | B2 | 5/2016 | Kelber | |
| 9,355,842 | B2 | 5/2016 | Seacrist | |
| 9,410,243 | B2 | 8/2016 | Sutter | |
| 9,496,060 | B2 | 11/2016 | Mikhailov | |

(Continued)

*Primary Examiner* — S. V. Clark
(74) *Attorney, Agent, or Firm* — John R. Pessetto; Charles A. Brill; Frank D. Cimino

(57) ABSTRACT

An integrated circuit includes an interconnect which includes a metal layer, a layer of graphene on at least one of the top surface of the interconnect or the bottom surface of the interconnect, and a layer of hexagonal boron nitride (hBN) on the layer of graphene, opposite from the metal layer. Dielectric material of the integrated circuit contacts the layer of hBN. The layer of graphene has one or more atomic layers of graphene. The layer of hBN is one to three atomic layers thick. The interconnect may have a lower graphene layer on the bottom surface of the metal layer with a lower hBN layer, and an upper graphene layer on the top surface of the metal layer, with an upper hBN layer.

20 Claims, 24 Drawing Sheets

(56) References Cited

U.S. PATENT DOCUMENTS

| | | |
|---|---|---|
| 2010/0218801 A1 | 9/2010 | Sung |
| 2011/0121264 A1 | 5/2011 | Choi |
| 2011/0163298 A1 | 7/2011 | Sung |
| 2012/0085991 A1 | 4/2012 | Cohen |
| 2012/0258587 A1 | 10/2012 | Kub |
| 2012/0325296 A1 | 12/2012 | Woo |
| 2013/0048339 A1 | 2/2013 | Tour |
| 2013/0059143 A1 | 3/2013 | Liang |
| 2014/0008611 A1 | 1/2014 | Geim |
| 2014/0008616 A1* | 1/2014 | Geim ................ H01L 29/1606 257/24 |
| 2014/0182646 A1 | 7/2014 | Choi |
| 2014/0264275 A1 | 9/2014 | Zhong |
| 2015/0108499 A1 | 4/2015 | Alptekin |
| 2015/0214048 A1 | 7/2015 | Suh |
| 2015/0236234 A1 | 8/2015 | Pruneri |
| 2015/0318401 A1 | 11/2015 | Duan |
| 2016/0038971 A9 | 2/2016 | Wong |
| 2016/0240692 A1 | 8/2016 | Shepard |
| 2016/0260604 A1 | 9/2016 | Wang |
| 2016/0284811 A1 | 9/2016 | Yu |
| 2017/0059514 A1* | 3/2017 | Hoffman ............ G01N 33/5438 |

\* cited by examiner

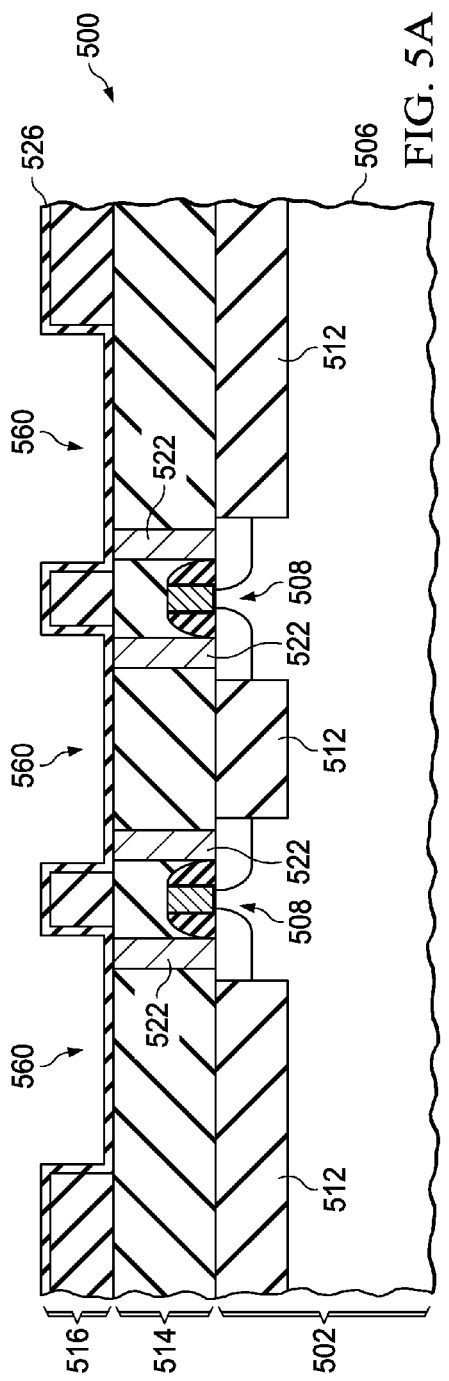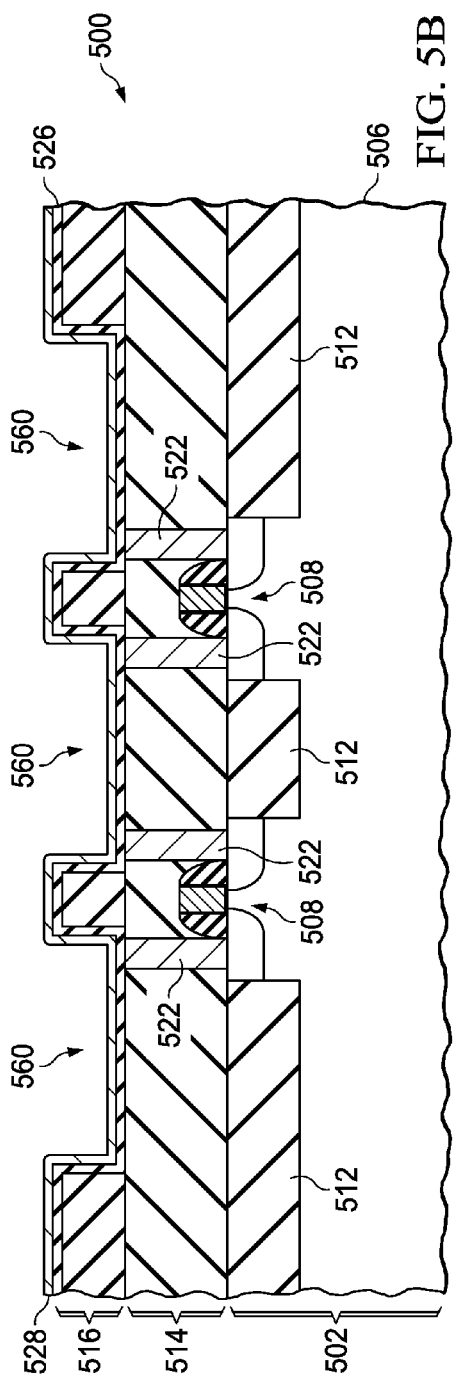

US 9,793,214 B1

HETEROSTRUCTURE INTERCONNECTS FOR HIGH FREQUENCY APPLICATIONS

FIELD OF THE DISCLOSURE

This disclosure relates to the field of integrated circuits. More particularly, this disclosure relates to interconnect structures in integrated circuits.

BACKGROUND OF THE DISCLOSURE

Integrated circuits are being fabricated with increasingly smaller components and interconnects. Metal interconnects, including etched aluminum interconnects and copper damascene interconnects, have difficulty handling increasing current densities. Moreover, it is sometimes desirable to reduce the thickness of the interconnects, exacerbating the current density problem. Graphene, having a very high in-plane electrical conductivity, has been proposed as an interconnect material. However, graphene layers more than a few atomic layers thick tend to exhibit degraded conductivity. Integrating thin layers of graphene into integrated circuits has been problematic, due to distortion of the graphene by dielectric materials contacting the graphene.

SUMMARY OF THE INVENTION

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit includes an interconnect which includes a metal layer, a layer of graphene on at least one of the top surface of the interconnect or the bottom surface of the interconnect, and a layer of hexagonal boron nitride (hBN) on the layer of graphene, opposite from the metal layer. Dielectric material of the integrated circuit contacts the layer of hBN, opposite from the graphene layer. The layer of graphene is comprised of one or more atomic layers of graphene. The layer of hBN is one to three atomic layers thick.

DESCRIPTION OF THE VIEWS OF THE DRAWINGS

FIG. 5A through FIG. 5G are cross sections of an integrated circuit including an etched aluminum interconnect having a lower graphene layer and an upper graphene layer, depicting successive stages of formation, according to an embodiment of the invention.

DETAILED DESCRIPTION OF EXAMPLE EMBODIMENTS

Figure 1:
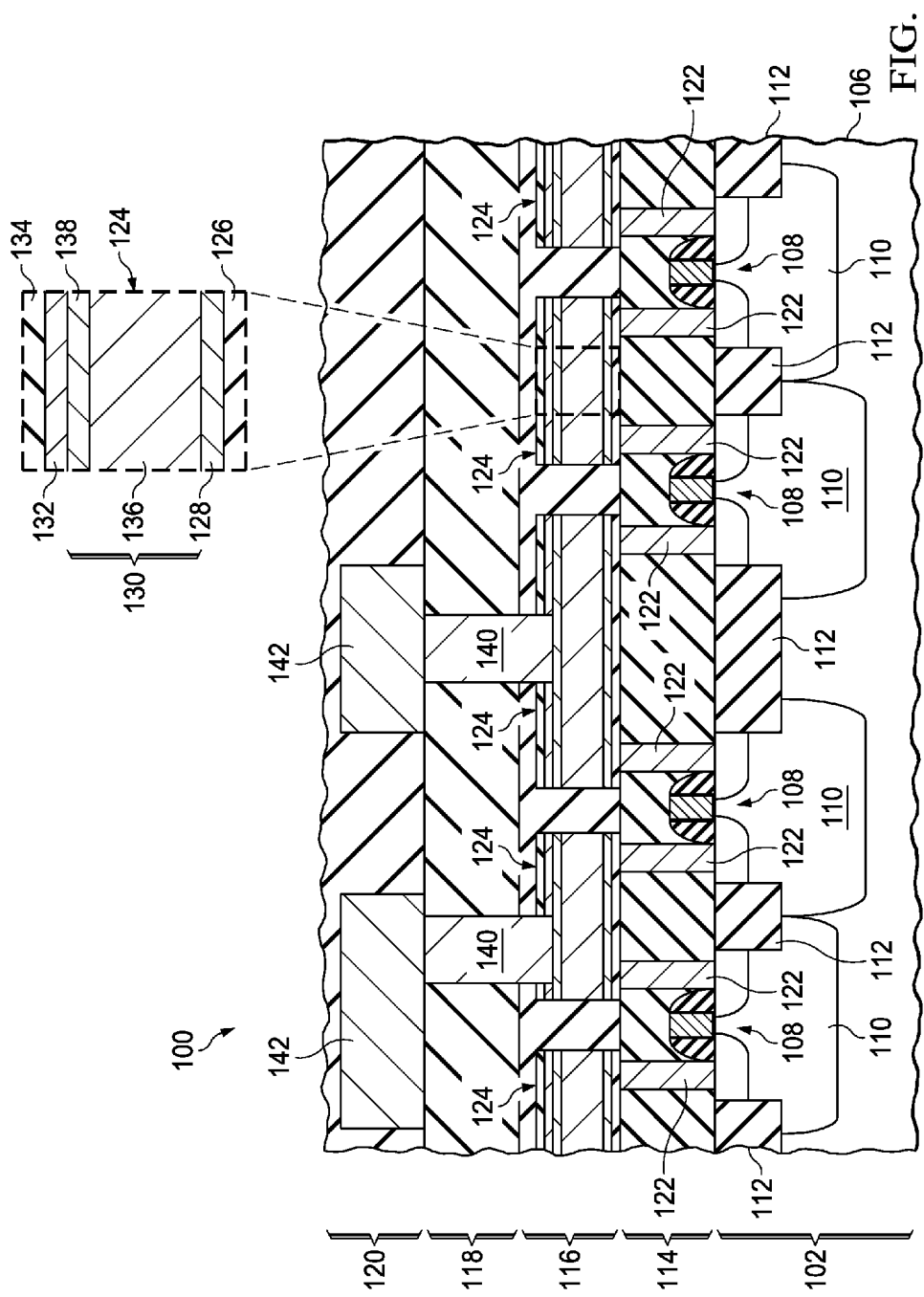
FIG. 1 is a cross section of an example integrated circuit including an etched aluminum interconnect having a lower graphene layer and an upper graphene layer, according to an embodiment of the invention.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/437,818. With its mention in this section, this patent application is not admitted to be prior art with respect to the present invention.

An integrated circuit includes an interconnect disposed in an interconnect region, the interconnect including a metal layer, a layer of graphene on at least one of the top surface of the interconnect or the bottom surface of the interconnect, and a layer of hBN on the layer of graphene, opposite from the metal layer. The layer of graphene is comprised of one or more atomic layers of graphene. The layer of graphene may be, for example, one to ten atomic layers thick, to maintain a desired electron mobility in the graphene. The layer of graphene may include Bernal graphene, which is described in reference to FIG. 7. The layer of hBN is one to three atomic layers thick. Dielectric material of the interconnect region of the integrated circuit contacts the layer of hBN. One example is disclosed herein in which the metal layer includes an etched aluminum layer. Another example is disclosed herein in which the metal layer includes a damascene copper layer. The layer of graphene provides a highly electrically conductive surface layer for the interconnect which may advantageously improve electrical conductivity at high frequencies, for example at millimeter wave frequencies or terahertz frequencies. Metal interconnects suffer from increased impedance at high frequencies due the current flowing close to surfaces of the metal, a phenomenon sometimes referred to as the "skin effect." The layer of graphene provides a highly conductive layer at the top and/or bottom surface of the metal interconnect, thus relieving the skin effect. The interconnect may be used in RF circuits or other high frequency applications. The electrical conductivity of the graphene layer improves by increasing the number of atomic layers to about ten atomic layers. Above ten atomic layers, the electrical conductivity of graphene has been observed to behave similar to graphite. The hBN layer is desirably thick enough to isolate the graphene layer from degradation by contact with the dielectric material, but should be thin enough to provide an adequate electrical connection to the graphene by a contact or via of the integrated circuit. Having one to three atomic layers of hBN has been shown to provide the desired balance between degradation of the graphene and electrical connectivity to the graphene layer.

For the purposes of this disclosure, the term "lateral" is understood to refer to a direction parallel to a plane of the top surface of the integrated circuit the term "vertical" is understood to refer to a direction perpendicular to the plane of the top surface of the integrated circuit.

FIG. 1 is a cross section of an example integrated circuit including an etched aluminum interconnect having a lower graphene layer and an upper graphene layer, according to an embodiment of the invention. The integrated circuit 100 includes a substrate 102 and an interconnect region 104 disposed over the substrate 102. The substrate 102 includes a semiconductor material 106 such as silicon, gallium nitride, or the like. Active components 108 are disposed in the semiconductor material 106. The active components 108 are depicted in FIG. 1 as metal oxide semiconductor (MOS) transistors 108 disposed in doped wells 110 of the semiconductor material 106, with gates extending above the semiconductor material 106. Other manifestations of the active components 108 are within the scope of the instant example. The active components 108 may be laterally separated by field oxide 112 disposed in the substrate 102. The field oxide 112 may have a shallow trench isolation (STI) structure, as depicted in FIG. 1, or may have a local oxidation of silicon (LOCOS) structure.

The interconnect region 104 of the instant example includes a pre-metal dielectric (PMD) layer 114 disposed directly above the substrate 102 and the active components 108, a first intra-metal dielectric (IMD) layer 116 disposed directly above the PMD layer 114, a first inter-level dielectric (ILD) layer 118 disposed directly above the first IMD layer 116, and a second IMD layer 120 disposed directly above the first ILD layer 118.

The PMD layer 114 includes a plurality of sub-layers of dielectric material, for example a PMD liner of silicon nitride, a gap fill layer of silicon dioxide, a main layer of phosphorus silicate glass (PSG) or boron phosphorus silicate glass (BPSG), and a cap layer of silicon nitride. Contacts 122 are disposed through the PMD layer 114, making electrical connections to the active components 108. The contacts 122 may include, for example, a first liner of titanium touching the PMD layer 114, a second liner of titanium nitride on the first liner, and a fill metal of tungsten on the second liner.

The first IMD layer 116 may include one or more sub-layers of dielectric material, including low-k dielectric material and a cap layer of silicon nitride, silicon carbide, or silicon nitride-carbide. First-level interconnects 124 are disposed in the first IMD layer 116. The first-level interconnects 124 make electrical connections to tops of the contacts 122. In the instant example, the first-level interconnects 124 include a lower hBN layer 126 disposed on the PMD layer 114, a lower graphene layer 128 disposed directly on the lower hBN layer 126, a metal layer 130 disposed directly on the lower graphene layer 128, an upper graphene layer 132 disposed directly on the metal layer 130, and an upper hBN layer 134 disposed directly on the upper graphene layer 132. Dielectric material of the PMD layer 114 touches the lower hBN layer 126, opposite from the lower graphene layer 128. Dielectric material of the first IMD layer 116 touches the upper hBN layer 134, opposite from the upper graphene layer 132. The metal layer 130 of the instant example includes an aluminum layer 136 disposed on the lower graphene layer 128 and a metal cap layer 138 disposed on the aluminum layer 136. The lower hBN layer 126 and the upper hBN layer 134 are each one to three atomic layers thick. The lower graphene layer 128 and the upper graphene layer 132 are each comprised of one or more atomic layers of graphene. The aluminum layer 136 may be, for example, 50 nanometers to 1 micrometer thick, and may include a few percent silicon, copper and/or titanium. The metal cap layer 138 may be, for example, 3 nanometers to 20 nanometers thick, and may include, for example, titanium nitride to provide an anti-reflection layer, or may include, for example, copper, nickel, palladium, platinum, iridium, rhodium, cerium, osmium, molybdenum, gold, or other metal suitable for catalysis of graphene.

The first ILD layer 118 may include one or more sub-layers of dielectric material, for example an etch stop layer of silicon nitride, a main layer of silicon dioxide or low-k dielectric material such as organosilicate glass (OSG), and a cap layer of silicon nitride. First-level vias 140 extend through the first ILD layer 118, and any portion of the first IMD layer 116 over the first-level interconnects 124, to make electrical connections to the first-level interconnects 124. The first-level vias 140 may extend to the upper graphene layer 132, the metal cap layer 138, or the aluminum layer 136. The first-level vias 140 may include, for example, a liner including titanium or titanium nitride touching the first ILD layer 118, and a fill metal of tungsten on the liner.

The second IMD layer 120 may include one or more sub-layers of dielectric material, including low-k dielectric material and a cap layer. Second-level interconnects 142 are disposed in the second IMD layer 120, making electrical connections to tops of the first-level vias 140. The second-level interconnects 142 may optionally have lower and/or upper graphene and hBN layers, similar to the first-level interconnects 124. The integrated circuit 100 may include additional ILD layers and IMD layers, vias and interconnects. The additional interconnects may optionally have lower and/or upper graphene and hBN layers, similar to the first-level interconnects 124.

Figure 2A:
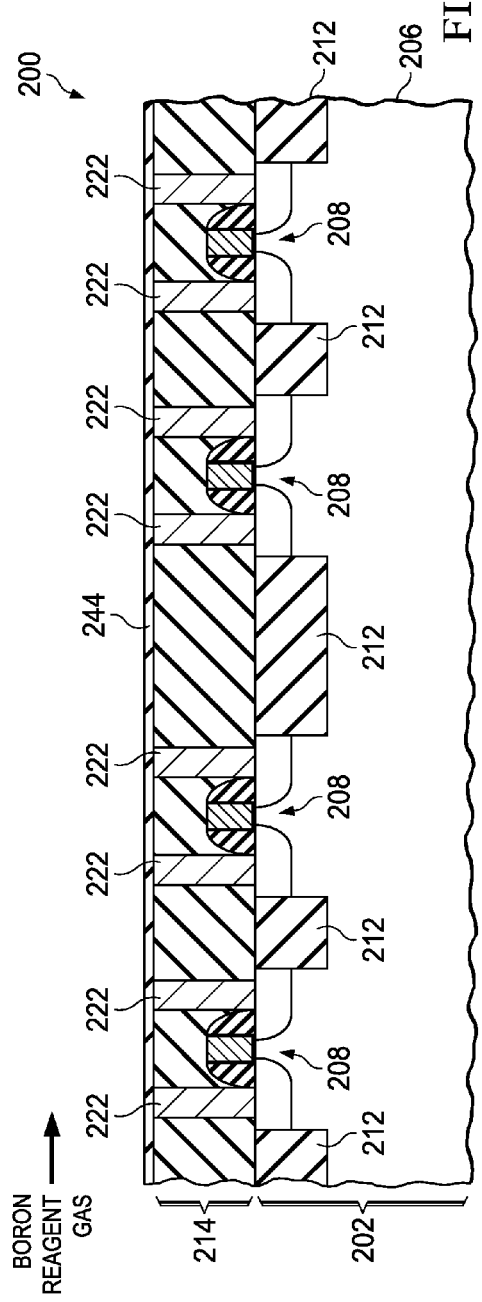
FIG. 2A through FIG. 2H are cross sections of an integrated circuit including an etched aluminum interconnect having a lower graphene layer and an upper graphene layer, depicting successive stages of formation, according to an embodiment of the invention.

FIG. 2A through FIG. 2H are cross sections of an integrated circuit including an etched aluminum interconnect having a lower graphene layer and an upper graphene layer, depicting successive stages of formation, according to an embodiment of the invention. Referring to FIG. 2A, the integrated circuit 200 includes a substrate 202 with a semiconductor material 206. Active components 208, depicted as MOS transistors 208, are formed in the semiconductor material 206. Field oxide 212 may be formed in the substrate 202 to laterally separate the active components 208.

A PMD layer 214 of an interconnect region of the integrated circuit 200 is formed over the substrate 202 and the active components 208. The PMD layer 214 may be formed by forming a sequence of sub-layers, for example, a PMD liner of silicon nitride using a low pressure chemical vapor deposition (LPCVD) process, a main layer of silicon dioxide-based dielectric material using a plasma enhanced chemical vapor deposition (PECVD) process or a high aspect ratio process (HARP) using ozone. The PMD layer 214 may be planarized, for example by an oxide chemical mechanical polish (CMP) process, before forming a cap layer of silicon nitride using a PECVD process.

Contacts 222 are formed through the PMD layer 214, extending to the active components 208. The contacts 222 may be formed by etching contact holes through the PMD layer 214, and forming a titanium liner, by sputtering or an ionized metal plasma (IMP) process, on the PMD layer 214 and extending into the contact holes. A titanium nitride liner is formed, by reactive sputtering or atomic layer deposition (ALD), on the titanium liner. A layer of tungsten is formed, by a metal organic chemical vapor deposition (MOCVD) process, on the titanium nitride liner, filling the contact holes. The tungsten, titanium nitride and titanium are removed from over a top surface of the PMD layer 214 by a tungsten CMP process, leaving the tungsten fill metal, titanium nitride liner and titanium liner in the contact holes to provide the contacts 222.

A lower hBN layer is formed over the PMD layer 214. In the instant example, the lower hBN layer is formed by an ALD process. A first step of the ALD process is depicted in FIG. 2A. A boron-containing reagent gas, denoted in FIG. 2A as BORON REAGENT GAS, is flowed over the integrated circuit 200. The boron-containing reagent gas may include, for example, boron trichloride ($BCl_3$) or borane ($BH_3$). The boron-containing reagent gas forms a boron-containing layer 244 over the PMD layer 214 and over tops of the contacts 222. Flow of the boron-containing reagent gas is subsequently ceased, leaving the boron-containing layer 244 in place for the second step of the ALD process.

Figure 2B:
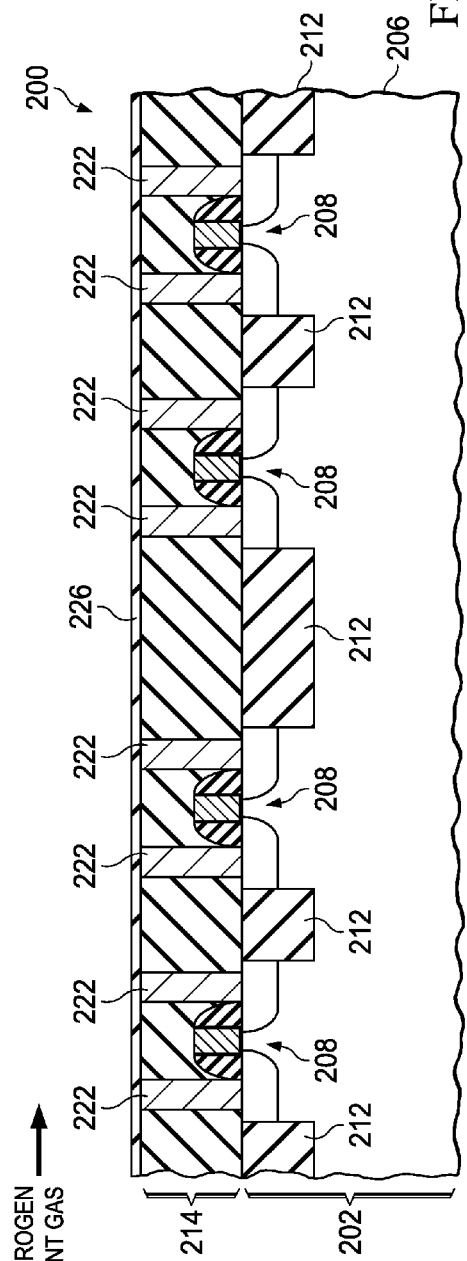

Referring to FIG. 2B, a nitrogen-containing reagent gas, denoted in FIG. 2B as NITROGEN REAGENT GAS, is flowed over the integrated circuit 200. The nitrogen-containing reagent gas may include, for example, ammonia gas ($NH_3$). Nitrogen from the nitrogen-containing reagent gas reacts with the boron-containing layer 244 of FIG. 2A to form an atomic layer of a lower hBN layer 226 over the PMD layer 214 and over the tops of the contacts 222. Flow of the nitrogen-containing reagent gas is subsequently ceased. The ALD process described in reference to FIG. 2A and FIG. 2B may be repeated to form a desired thickness, one to three atomic layers, of the lower hBN layer 226.

Figure 2C:
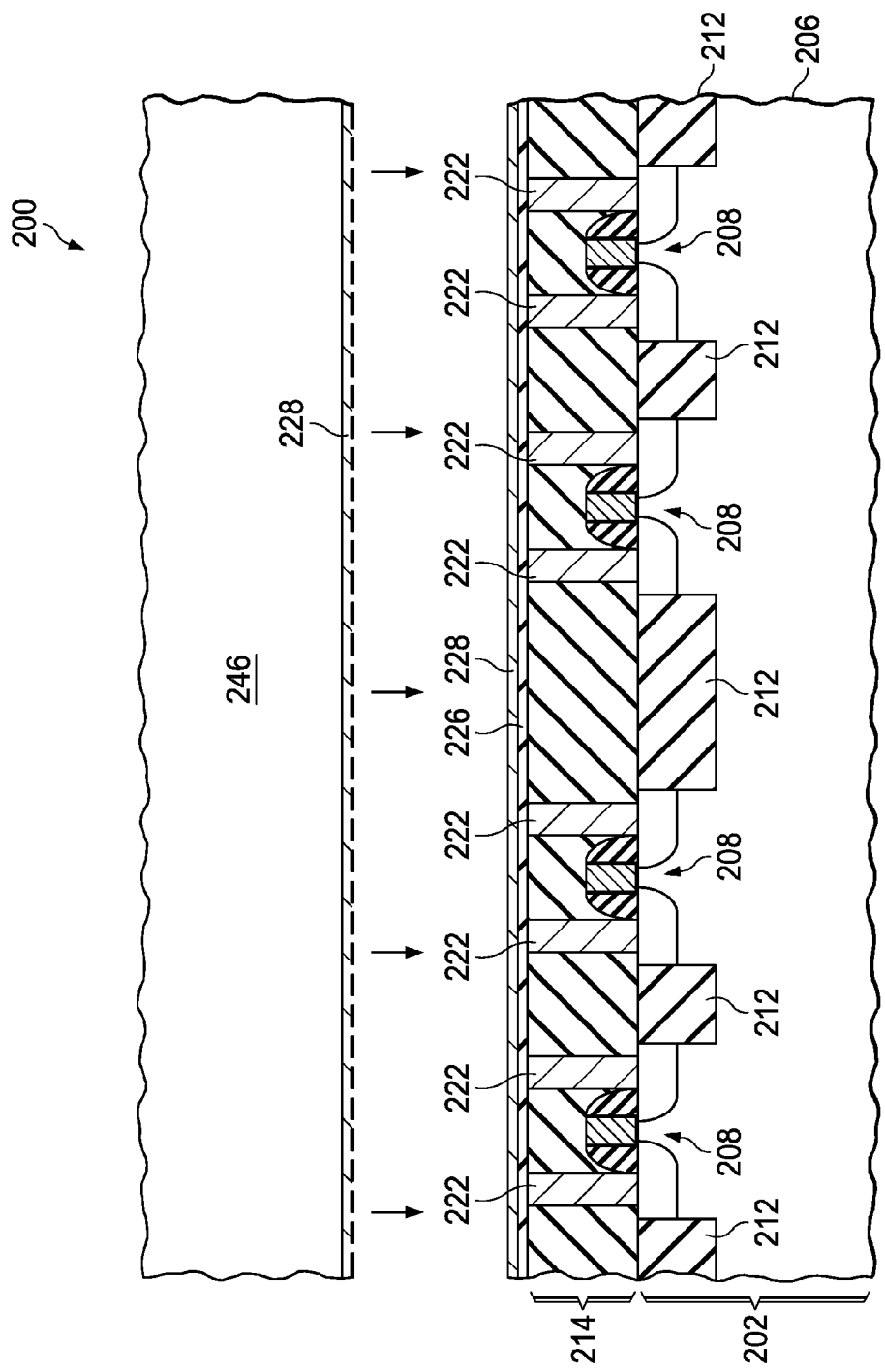

Referring to FIG. 2C, a lower graphene layer 228 is formed on the lower hBN layer 226 by a transfer process. The lower graphene layer 228 is first formed on a growth substrate 246, which may be, for example, a silicon wafer with a catalyst surface layer. The lower graphene layer 228 may be formed on the growth substrate by a chemical vapor deposition (CVD) process or a PECVD process at a higher temperature than can be tolerated by the integrated circuit 200, for example, over 800° C. The lower graphene layer 228 is subsequently transferred to the integrated circuit 200, for example by inducing stress between the lower graphene layer 228 and the growth substrate 246, causing the lower graphene layer 228 to separate from the growth substrate 246. Bonding between the lower graphene layer 228 and the lower hBN layer 226 may be enhanced by a combination of heat and pressure. The lower graphene layer 228 includes one or more atomic layers of graphene.

Figure 2D:
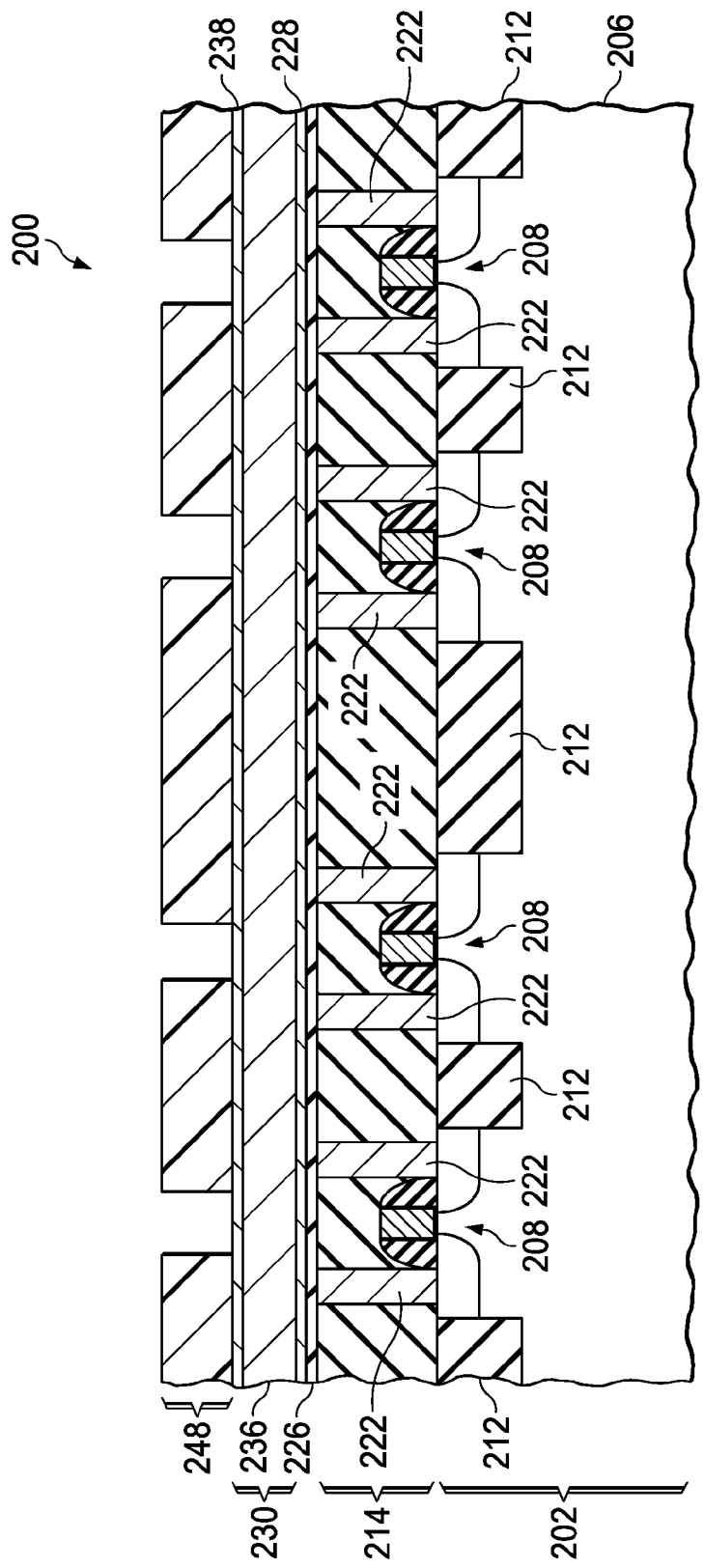

Referring to FIG. 2D, a metal layer 230, including an aluminum layer 236 and a metal cap layer 238, is formed on the lower graphene layer 228. The aluminum layer 236 may include, for example, at least 95 percent aluminum and a few percent silicon, copper, and/or titanium. In the instant example, the metal cap layer 238 includes a catalyst such as copper, nickel, palladium, platinum, iridium, rhodium, cerium, osmium, molybdenum, and/or gold. The aluminum layer 236 may be formed by a sputter process. The metal cap layer 238 may be formed by a sputter process or an evaporation process. A metal isolation layer, not shown, may be formed on the aluminum layer 236 before forming the metal cap layer 238, to reduce diffusion of aluminum into the metal cap layer 238 and to reduce diffusion of catalyst into the aluminum layer 236. The metal isolation layer may include, for example, titanium nitride or tantalum nitride.

An etch mask 248 is formed over the metal layer 230 which covers areas for subsequently formed first-level interconnects. The etch mask 248 may include photoresist formed by a photolithographic process, and may optionally include an anti-reflection layer such as a bottom anti-reflection coat (BARC) or the like. Alternatively, the etch mask 248 may include hard mask materials, such as silicon nitride and/or amorphous carbon.

Figure 2E:
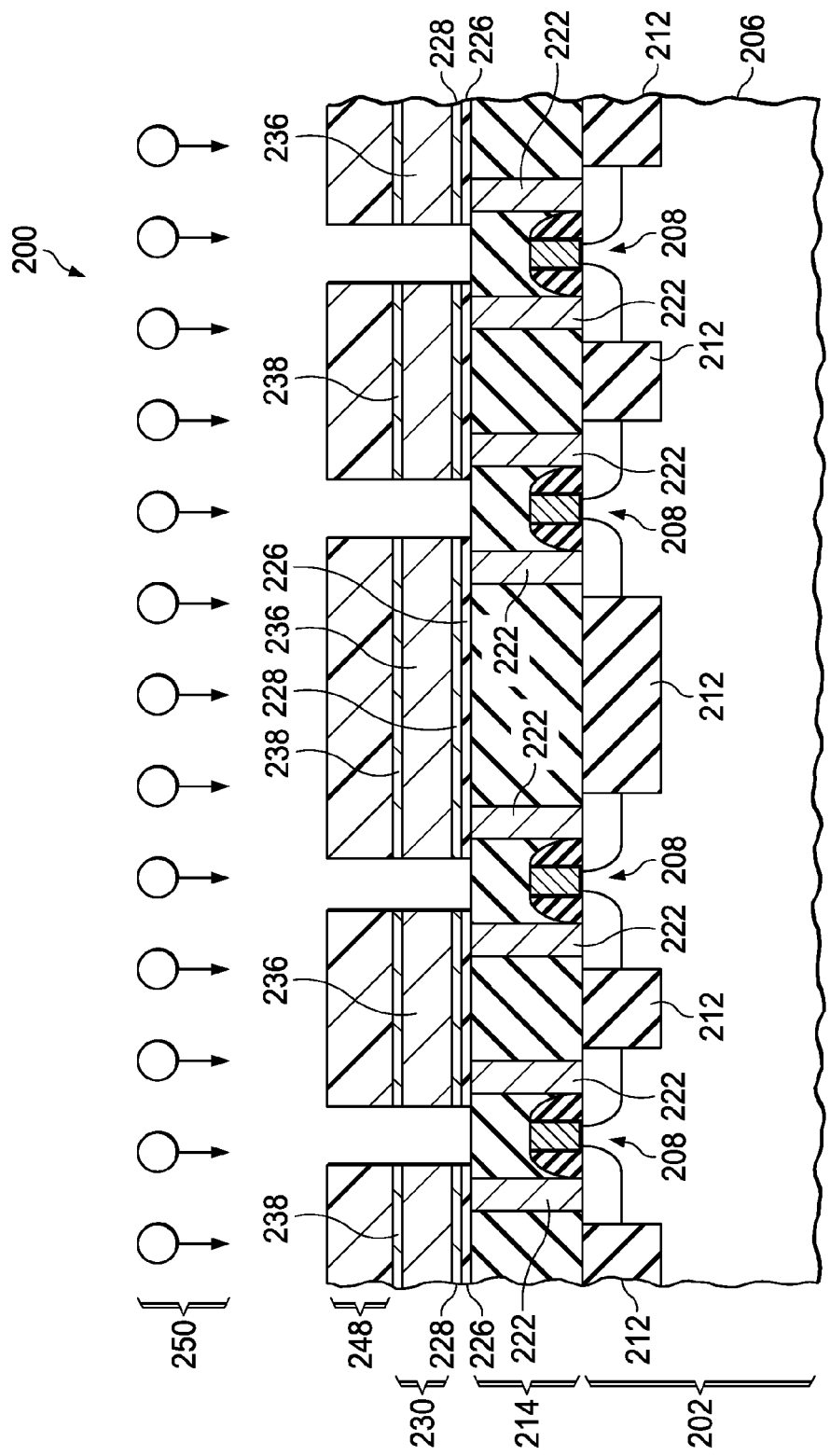

Referring to FIG. 2E, the metal layer 230 and the lower graphene layer 228, and optionally the lower hBN layer 226, are removed in areas exposed by the etch mask 248 by a reactive ion etch (RIE) process using halogen radicals and oxygen radicals 250. The RIE process may alter the type and concentration of the halogen radicals and oxygen radicals 250 to remove the assorted materials in the metal cap layer 238, the aluminum layer 236, the lower graphene layer 228 and the lower hBN layer 226. After the RIE process is completed, the etch mask 248 is removed. Organic material and amorphous carbon in the etch mask 248 may be removed by an oxygen plasma process. Silicon nitride or other hard mask materials in the etch mask 248 may be removed by a plasma process using fluorine radicals and oxygen radicals.

Figure 2F:
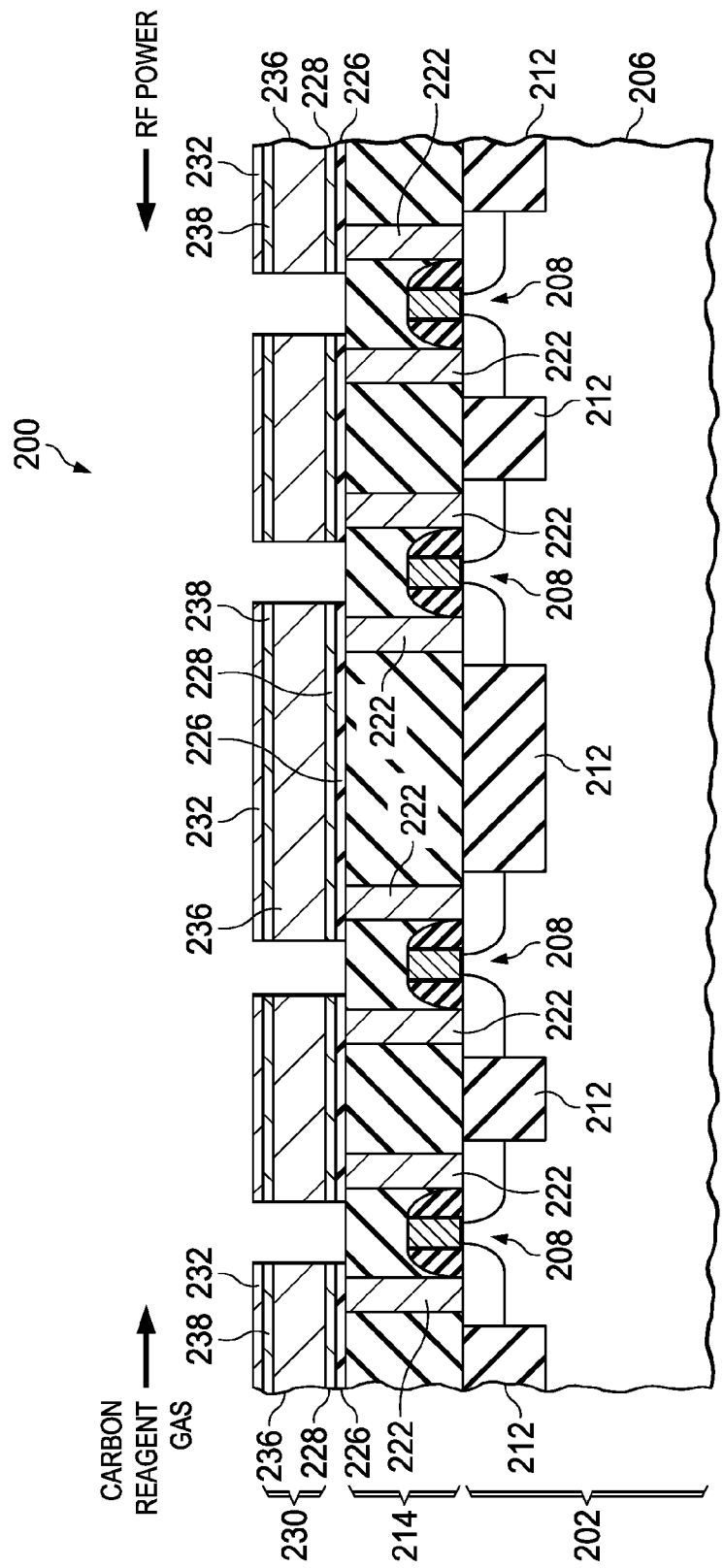

Referring to FIG. 2F, an upper graphene layer 232 is selectively formed on the metal cap layer 238 by a graphene PECVD process. In the graphene PECVD process, the integrated circuit 200 is heated, for example to a temperature of 200° C. to 400° C. A carbon-containing reagent gas, denoted in FIG. 2F as CARBON REAGENT GAS is flowed over the integrated circuit (200) and radio-frequency (RF) power, denoted in FIG. 2F as RF POWER is applied to the carbon-containing reagent gas to generate carbon radicals above the integrated circuit (200). The carbon-containing reagent gas may include methane, straight chain alkanes such as ethane, propane and/or butane, alcohols such as ethanol, and/or cyclic hydrocarbons such as cyclobutane or benzene. Additional gases, such as hydrogen, argon and/or oxygen, may be flowed over the integrated circuit (200). The catalyst in the metal cap layer 238 catalyzes the carbon radicals to react to form the upper graphene layer 232 selectively on the metal cap layer 238. The upper graphene layer 232 includes one or more atomic layers of graphene. Graphene is not formed on the integrated circuit (200) beyond the metal cap layer 238.

Figure 2G:
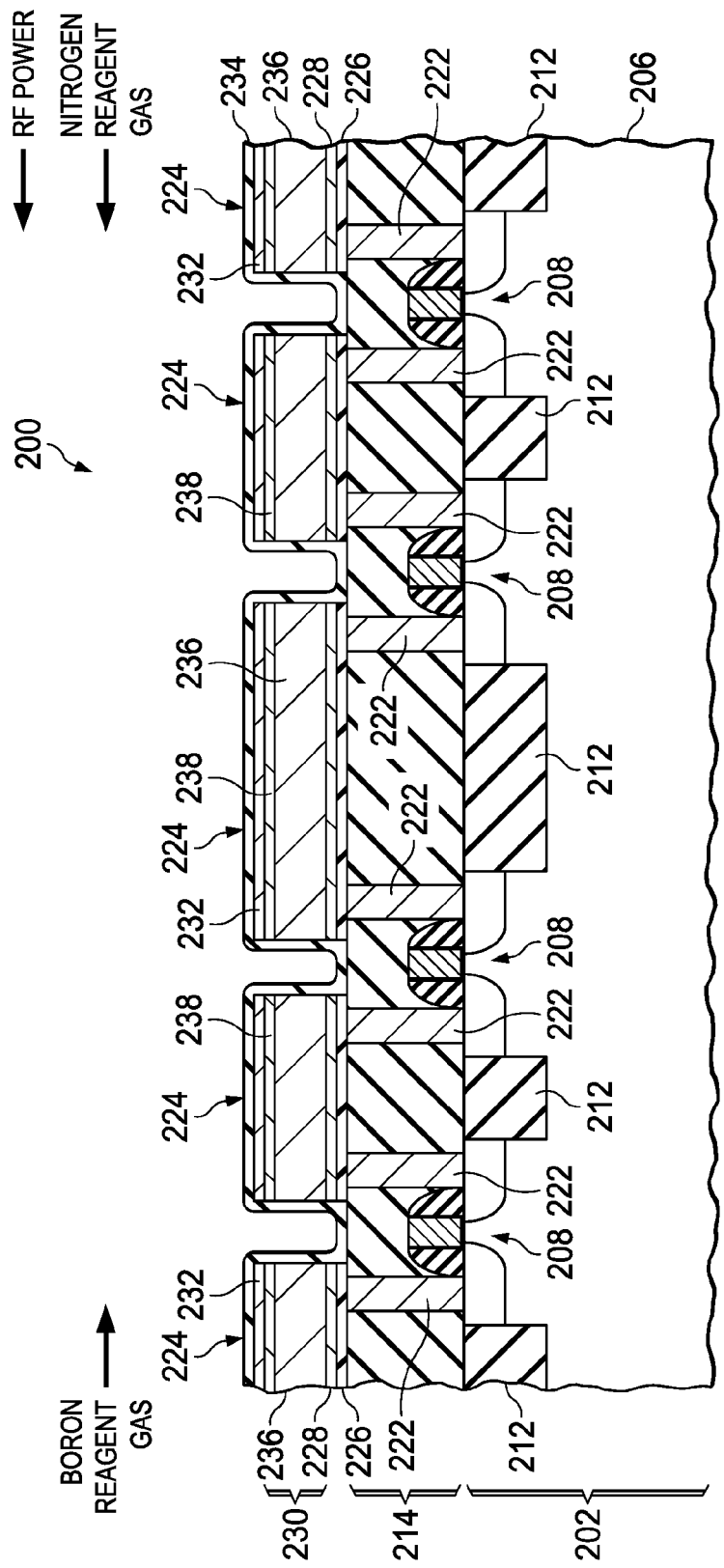

Referring to FIG. 2G, an upper hBN layer 234 is formed on the upper graphene layer 232 and conformally on lateral surfaces of the metal layer 230 and the lower graphene layer 228, extending onto the lower hBN layer 226 and/or the PMD layer 214. The upper hBN layer 234 is formed in the instant example by a boron nitride PECVD process. A boron-containing reagent gas, denoted in FIG. 2G as BORON REAGENT GAS, and a nitrogen-containing reagent gas, denoted as NITROGEN REAGENT GAS, are flowed concurrently over the integrated circuit 200. The boron-containing reagent gas may include, for example, boron trichloride or borane. The nitrogen-containing reagent gas may include, for example, ammonia gas. Additional gases, such as hydrogen and/or argon, may be flowed over the integrated circuit 200 with the boron-containing reagent gas and the nitrogen-containing reagent gas. RF power, denoted as RF POWER is applied to the boron-containing reagent gas and the nitrogen-containing reagent gas to generate boron radicals and nitrogen radicals above the integrated circuit (200). The boron radicals and the nitrogen radicals react on the integrated circuit 200 to form the upper hBN layer 234. The upper hBN layer 234 is one to three atomic layers thick. A combination of the lower hBN layer 226, the lower graphene layer 228, the metal layer 230, the upper graphene layer 232 and the upper hBN layer 234 provides first-level interconnects 224 of the integrated circuit 200.

Figure 2H:
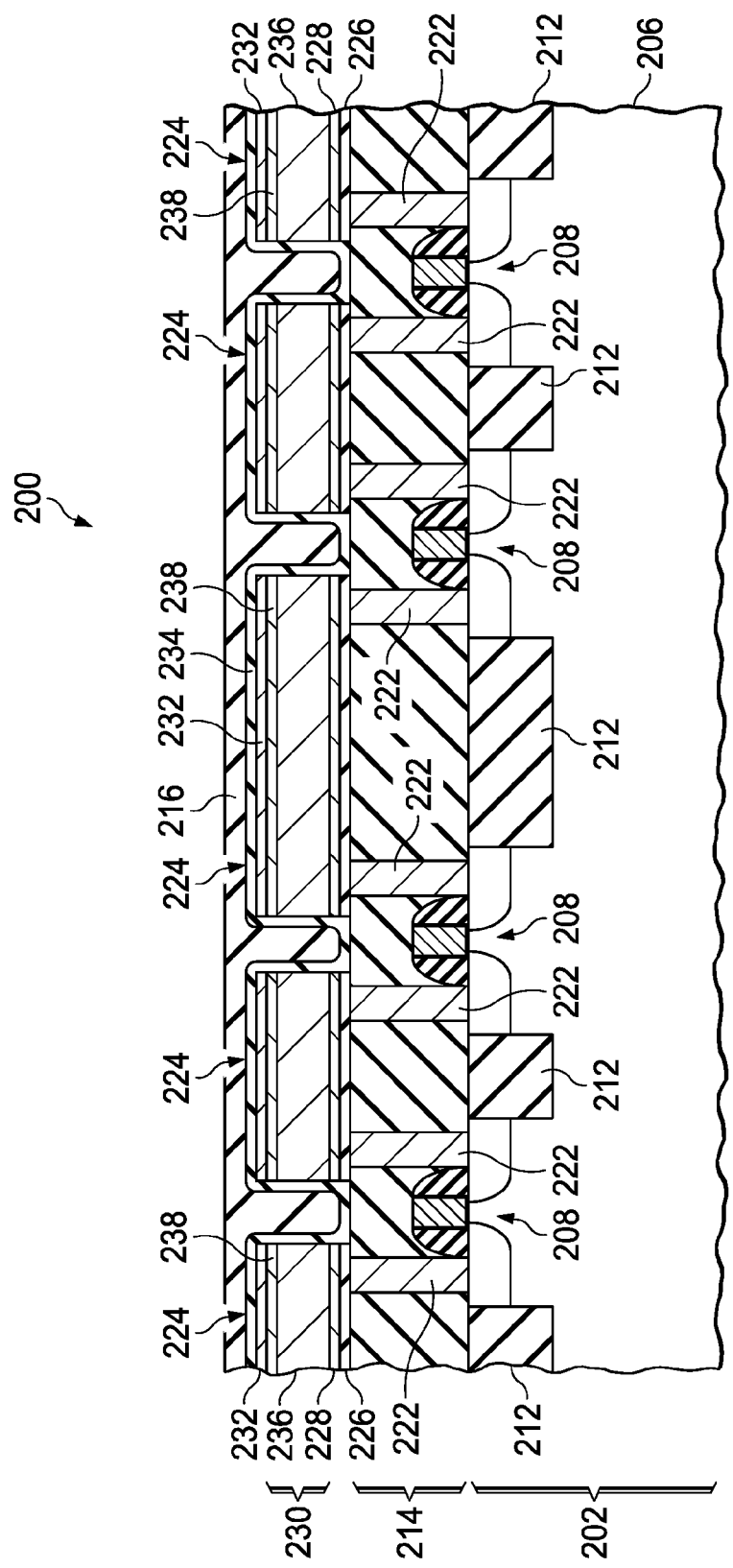

Referring to FIG. 2H, a first IMD layer 216 is formed over the first-level interconnects 224 and the PMD layer 214. The first IMD layer 216 may be formed by forming an etch stop layer of silicon nitride, followed by forming a main layer of OSG or silicon dioxide. The various layers of the first IMD layer 216 may be formed by separate PECVD processes. The main layer may be planarized by an oxide CMP process, followed by forming a cap layer of silicon nitride. Formation of the integrated circuit 200 is continued by forming ILD layers, additional IMD layers, vias and interconnects. Additional interconnects may be formed above the first-level interconnects 224 by a similar process to that disclosed in reference to FIG. 2A through FIG. 2G.

Figure 3A:
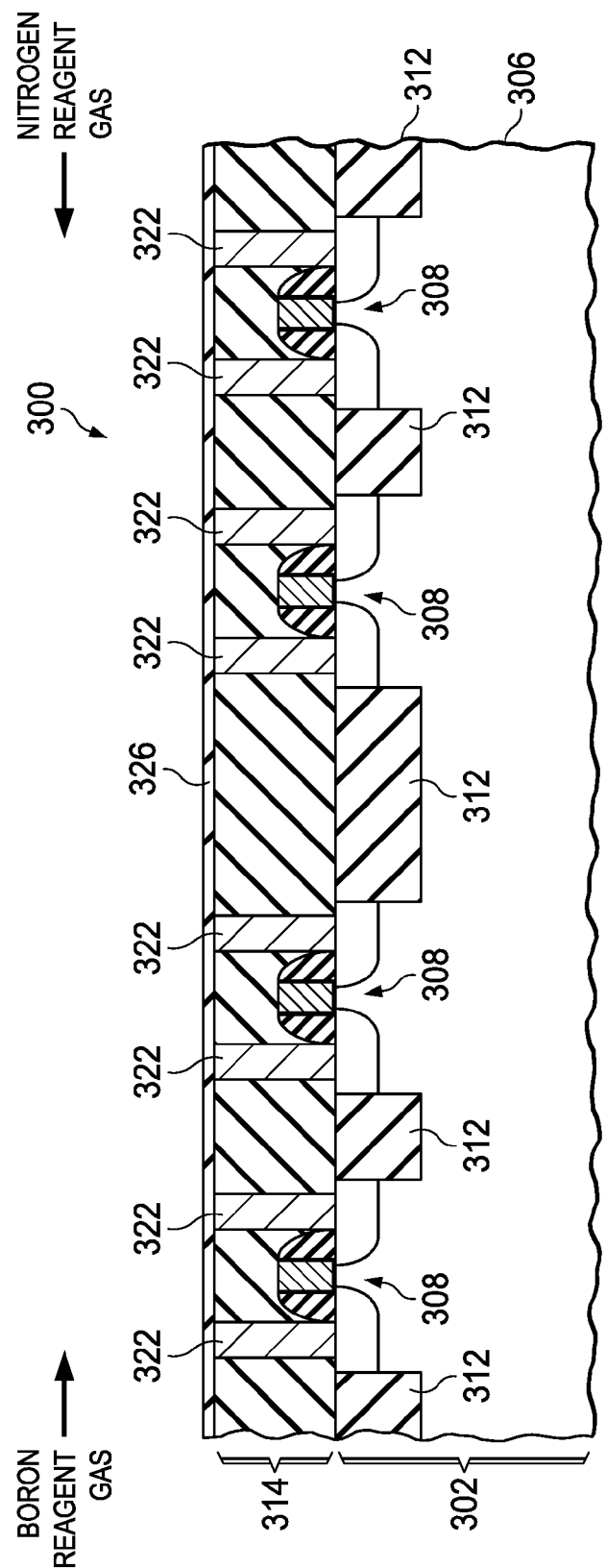
FIG. 3A through FIG. 3H are cross sections of an integrated circuit including an etched aluminum interconnect having a lower graphene layer and an upper graphene layer, depicting successive stages of formation, according to another embodiment of the invention.

FIG. 3A through FIG. 3H are cross sections of an integrated circuit including an etched aluminum interconnect having a lower graphene layer and an upper graphene layer, depicting successive stages of formation, according to another embodiment of the invention. Referring to FIG. 3A, the integrated circuit 300 includes a substrate 302 with a semiconductor material 306. Active components 308, depicted as MOS transistors 308, are formed in the semiconductor material 306. Field oxide 312 may be formed in the substrate 302 to laterally separate the active components 308. A PMD layer 314 of an interconnect region of the integrated circuit 300 is formed over the substrate 302 and the active components 308. Contacts 322 are formed through the PMD layer 314, extending to the active components 308.

A lower hBN layer 326 is formed over the PMD layer 314. In the instant example, the lower hBN layer 326 may be formed by an ALD process using a boron-containing reagent gas, denoted in FIG. 3A as BORON REAGENT GAS and a nitrogen-containing reagent gas, denoted as NITROGEN REAGENT GAS, for example as described in reference to FIG. 2A and FIG. 2B.

Figure 3B:
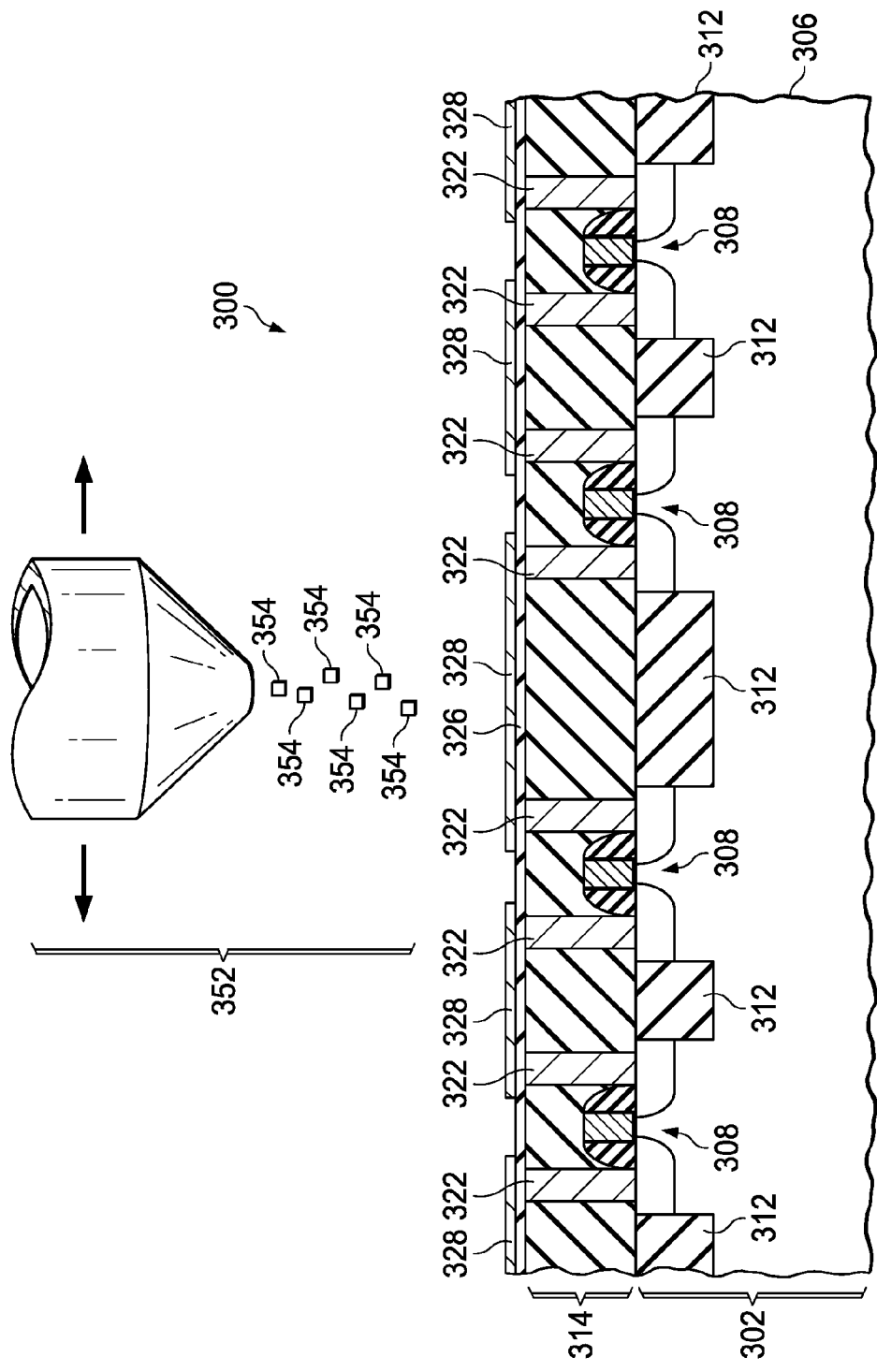

Referring to FIG. 3B, a lower graphene layer 328 is formed on the lower hBN layer 326 by dispensing graphene flakes 354, possibly combined with a carrier fluid, using an additive process 352, such as an electrostatic deposition process, an inkjet process, or such. The additive process 352 may form the lower graphene layer 328 in areas for subsequently formed first-level interconnects, simplifying fabrication of the integrated circuit 300. The lower graphene layer 328 includes one or more atomic layers of graphene. Because hBN has a lattice spacing and atomic pattern that match graphene very closely, the graphene flakes may align with the lattice of the lower hBN layer 326 to produce a continuous layer of graphene in the lower graphene layer 328 with desired values of electrical properties such as sheet resistance.

Figure 3C:
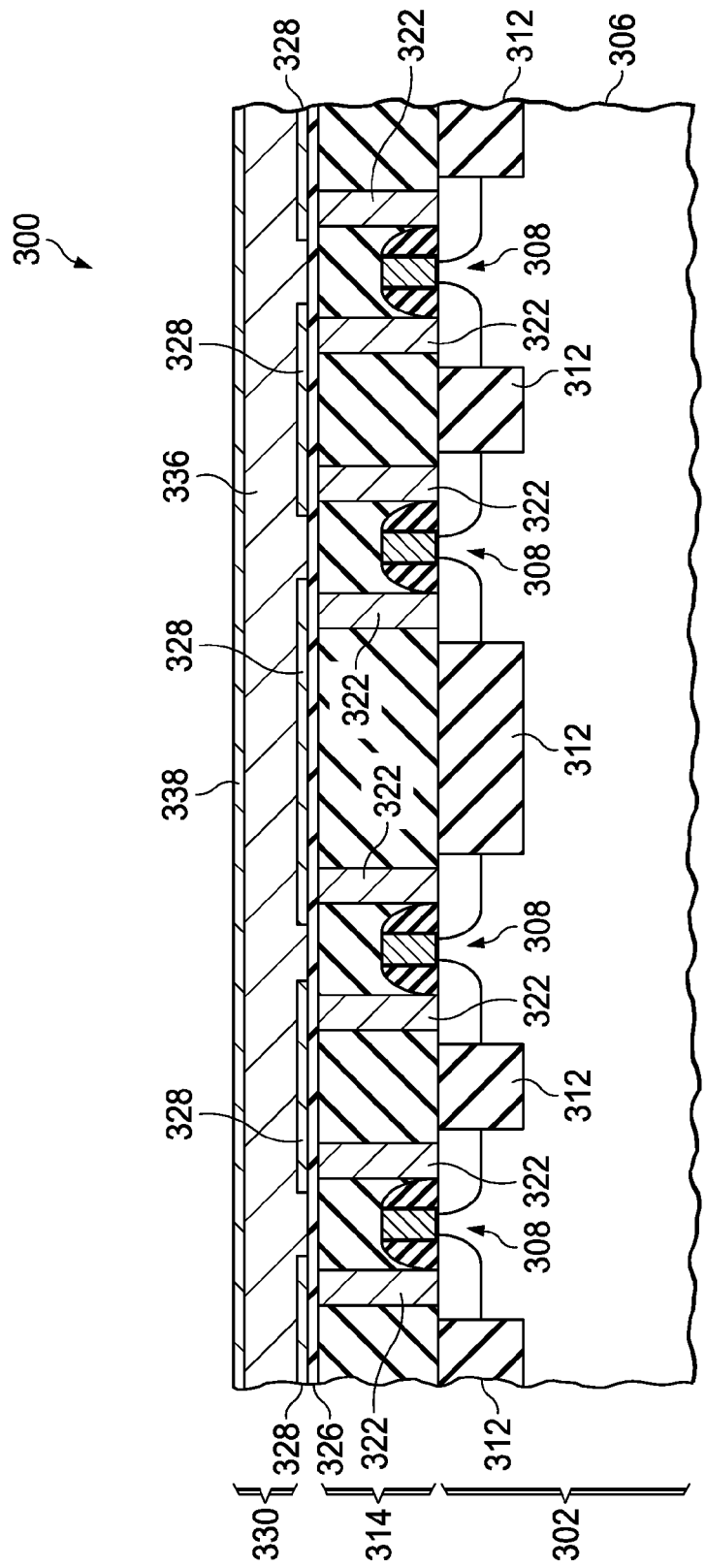

Referring to FIG. 3C, a metal layer 330, including an aluminum layer 336 and an optional metal cap layer 338, is formed on the lower graphene layer 328. In the instant example, the metal cap layer 338 may include titanium nitride to provide an anti-reflection layer and a diffusion barrier to contain the aluminum. The aluminum layer 336 may be formed by a sputter process. The metal cap layer 338 may be formed by a sputter process or an ALD process.

Figure 3D:
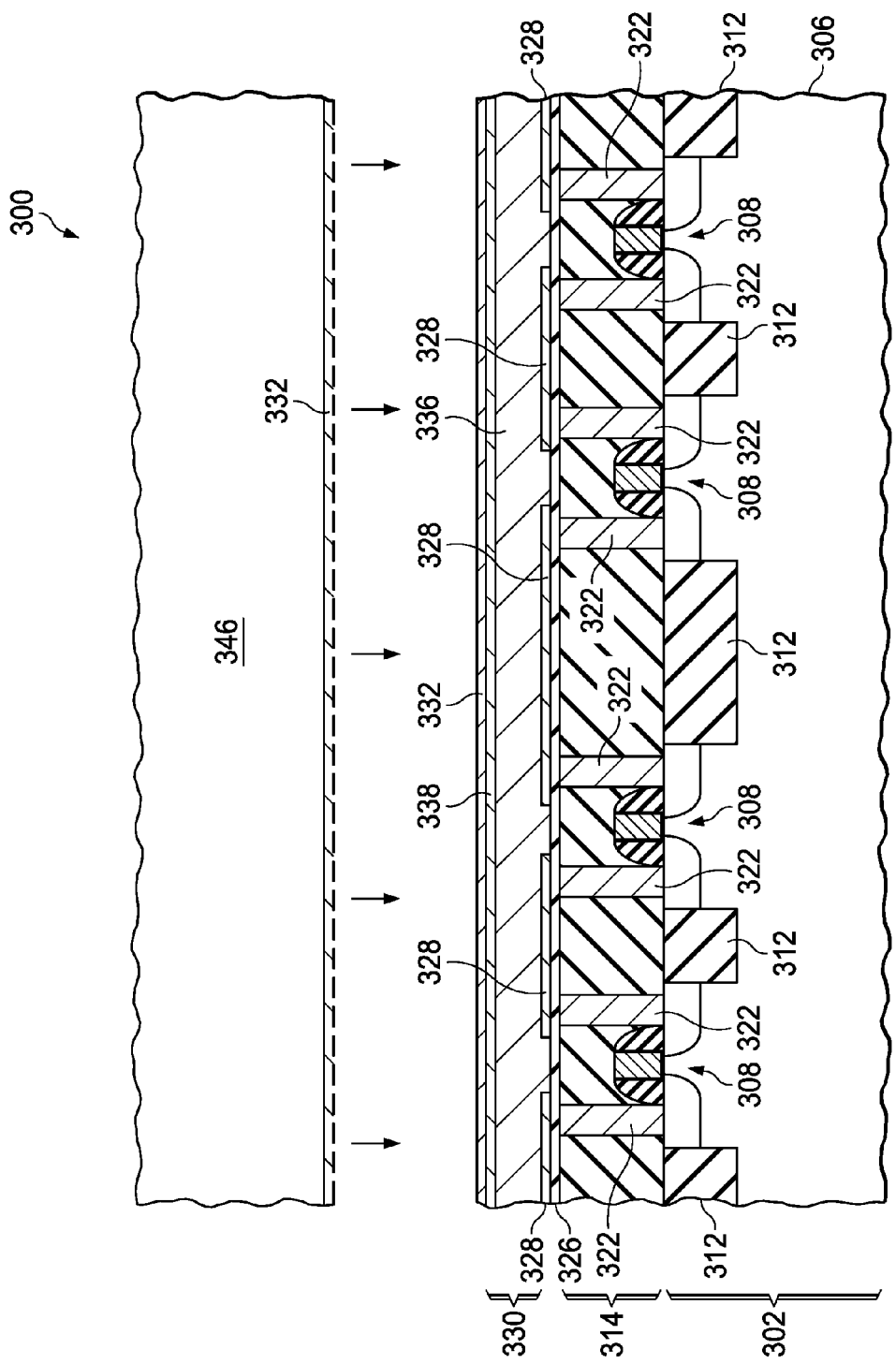

Referring to FIG. 3D, an upper graphene layer 332 is formed on the metal layer 330. The upper graphene layer 332 may be formed by a transfer process from a growth substrate 346, as depicted in FIG. 3D. The upper graphene layer 332 includes one or more atomic layers of graphene. Other methods of forming the upper graphene layer 332 are within the scope of the instant example.

Figure 3E:
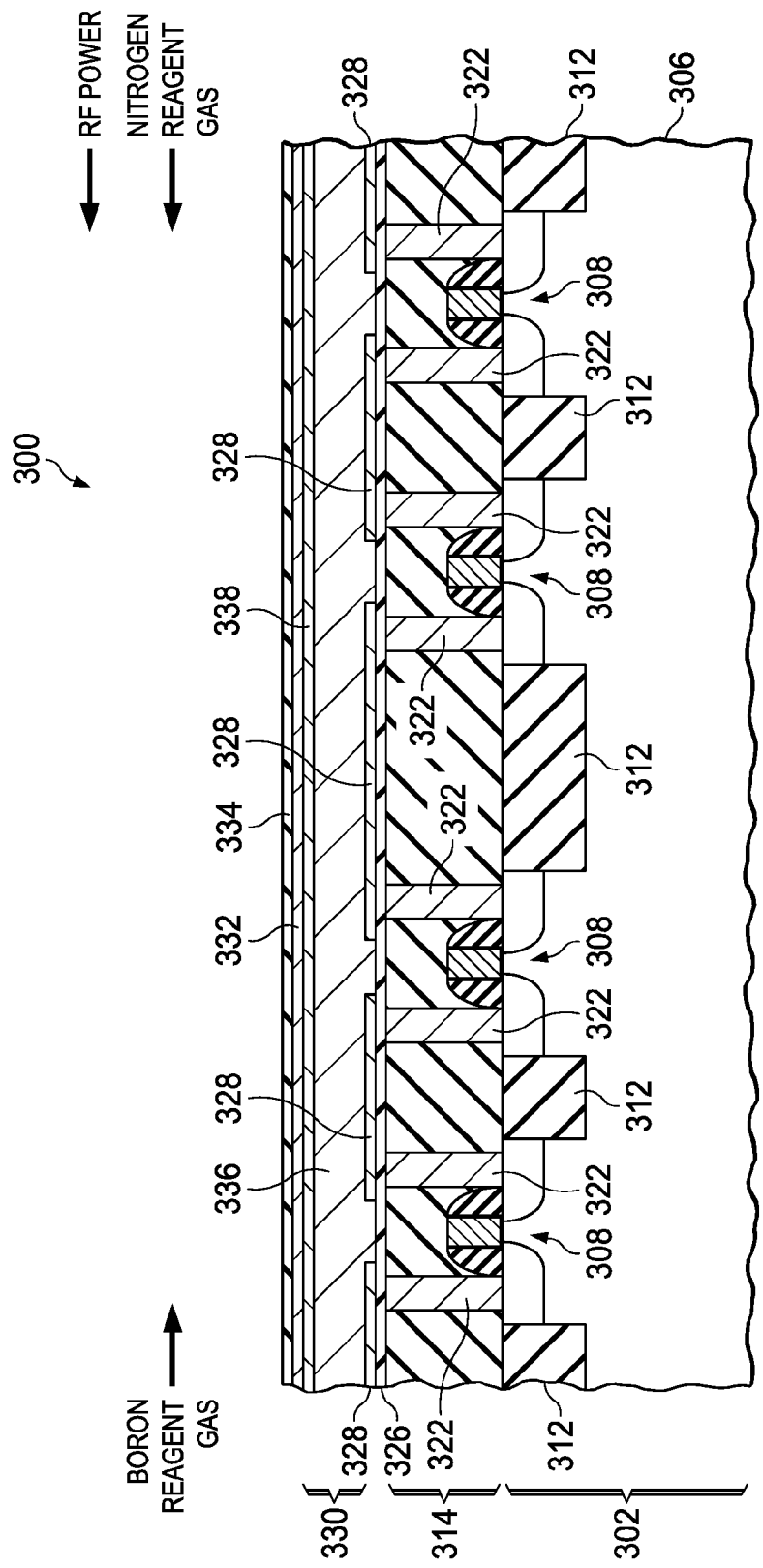

Referring to FIG. 3E, an upper hBN layer 334 is formed on the upper graphene layer 332. The upper hBN layer 334 is one to three atomic layers thick. The upper hBN layer 334 may be formed by a PECVD process using a boron-containing reagent gas, denoted as BORON REAGENT GAS in FIG. 3E, and a nitrogen-containing reagent gas, denoted as NITROGEN REAGENT GAS, and one or more other gases. The boron-containing reagent gas may include boron trichloride and/or borane. The nitrogen-containing reagent gas may include ammonia gas. The other gases may include argon, hydrogen and/or oxygen. RF power, denoted RF POWER, is applied to the boron-containing reagent gas, the nitrogen-containing reagent gas, and the other gases to form boron radicals and nitrogen radicals. The boron radicals and nitrogen radicals react to form the upper hBN layer 334. Other processes to form the upper hBN layer 334 are within the scope of the instant example.

Figure 3F:
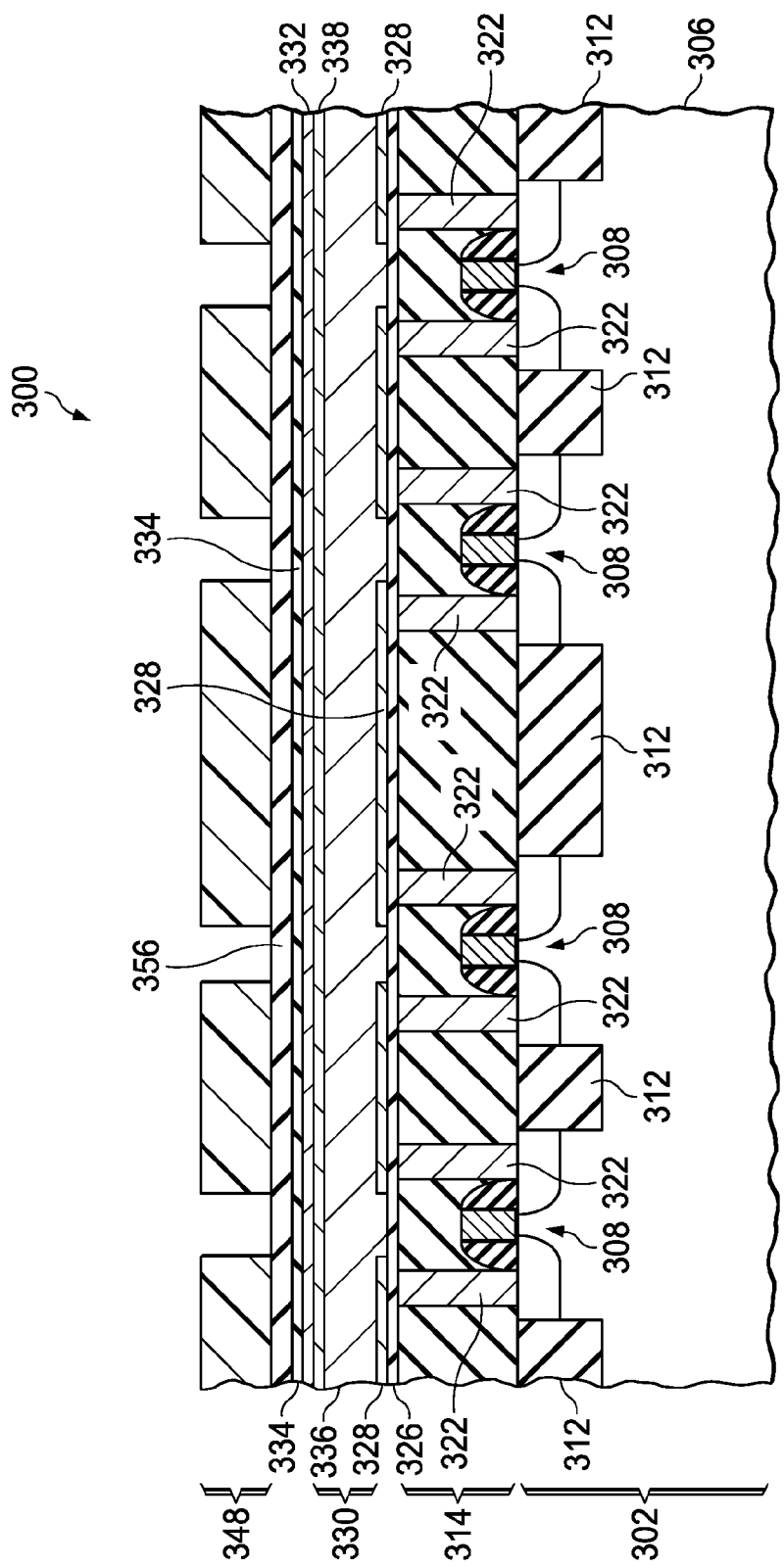

Referring to FIG. 3F, an optional protective layer 356 may be formed over the upper hBN layer 334. The protective layer 356 may include, for example, 10 nanometers to 50 nanometers of silicon dioxide formed by a PECVD process using tetraethyl orthosilicate (TEOS). Subsequently, an etch mask 348 is formed over the upper hBN layer 334, and over the protective layer 356, if present. The etch mask 348 covers areas for subsequently formed first-level interconnects. The etch mask 348 may be formed by a similar process to that disclosed in reference to FIG. 2D. In the instant example, the etch mask 348 is aligned with the lower graphene layer 328. The purpose of the protective layer 356 in the instant example is to protect the upper hBN layer 334 during subsequent removal of the etch mask 348.

Figure 3G:
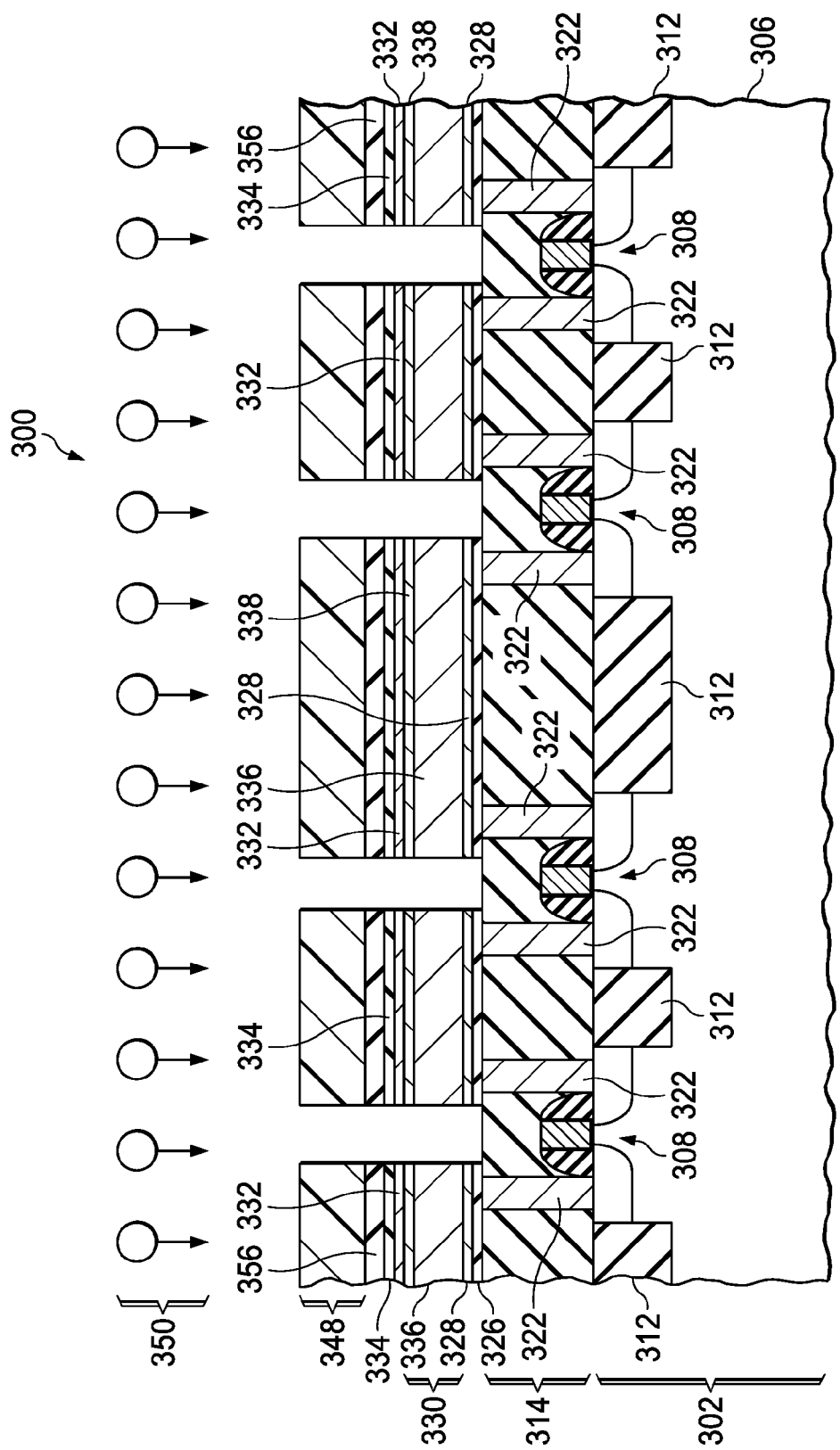

Referring to FIG. 3G, the protective layer 356, if present, the upper hBN layer 334, the upper graphene layer 332, the metal layer 330, the lower graphene layer 328 and optionally the lower hBN layer 326, are removed in areas exposed by the etch mask 348 by an RIE process using halogen radicals and oxygen radicals 350. The types and concentrations of the halogen radicals and oxygen radicals 350 may be varied as needed to remove the varying materials with a desired etch profile.

Figure 3H:
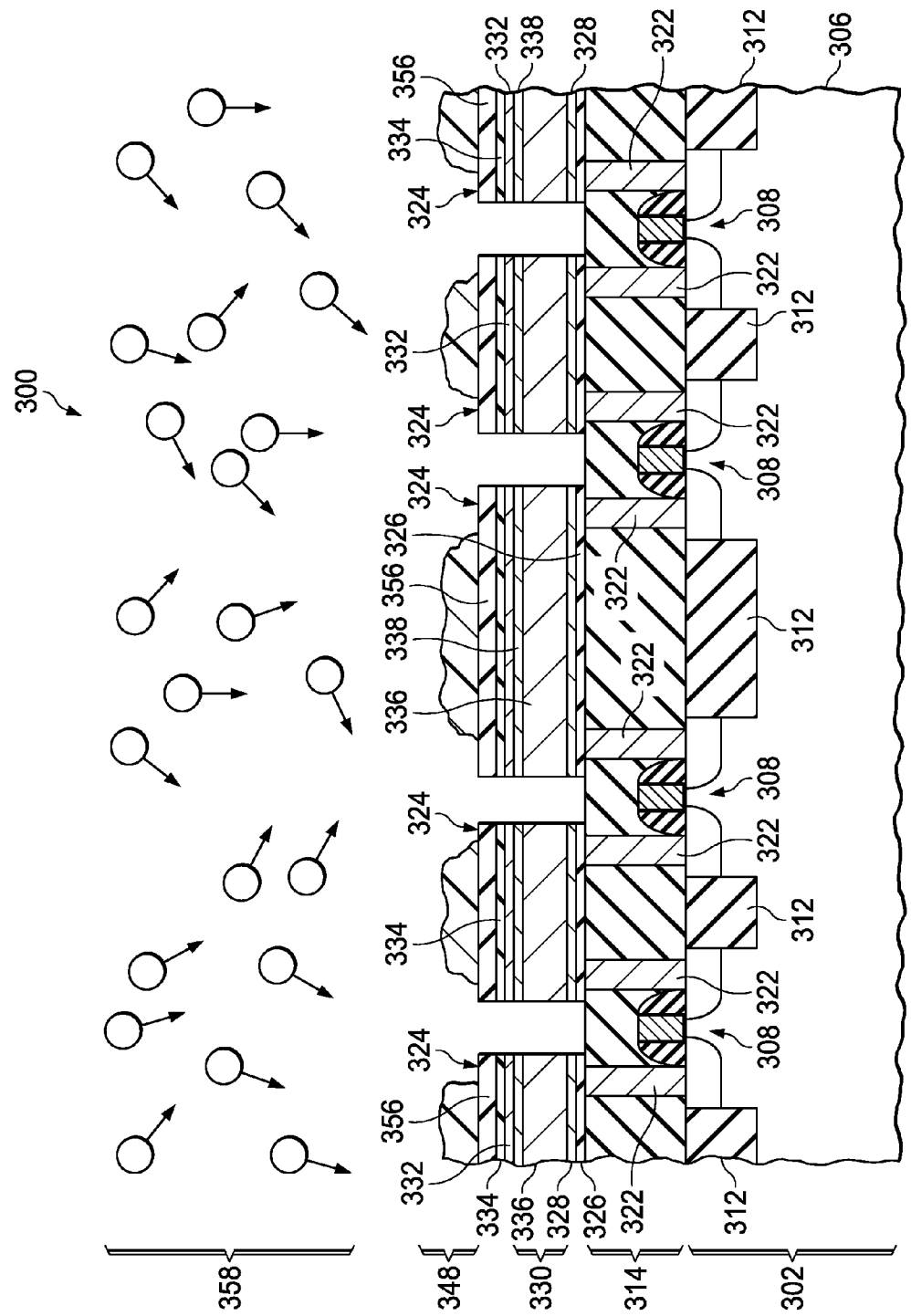

Referring to FIG. 3H, after the RIE process disclosed in reference to FIG. 3G is completed, the etch mask 348 is removed, for example by an oxygen plasma process using oxygen radicals 358. The protective layer 356, if present, protects the upper hBN layer 334 from damage by the oxygen radicals 358 during removal of the etch mask 348.

A combination of the lower hBN layer 326, the lower graphene layer 328, the metal layer 330, the upper graphene layer 332 and the upper hBN layer 334 provides first-level interconnects 324 of the integrated circuit 300. Formation of the integrated circuit 300 is continued by forming a first IMD layer between the first-level interconnects 324. Formation of the integrated circuit 300 is further continued by subsequently forming ILD layers, additional IMD layers, vias, and additional interconnects.

Figure 4:
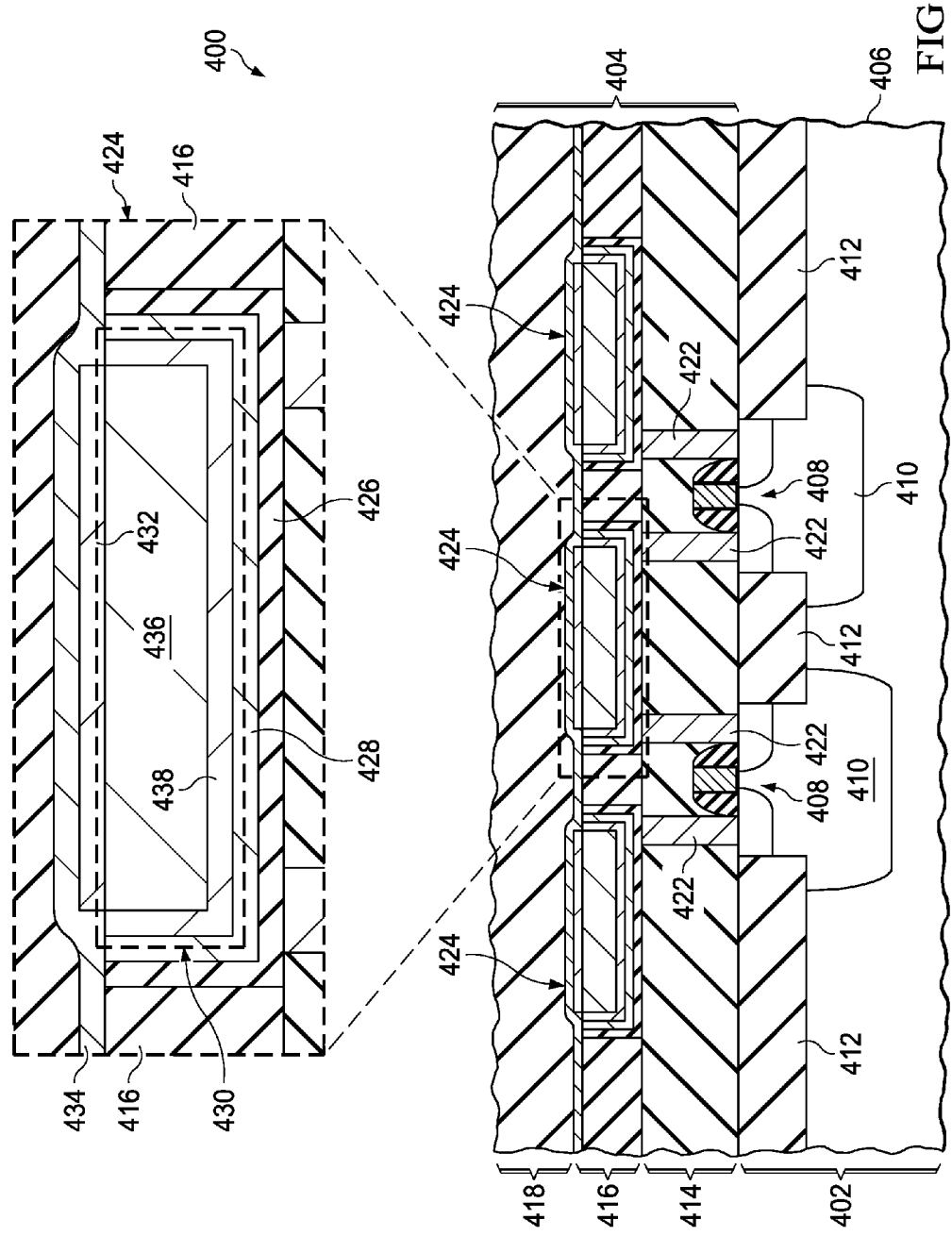
FIG. 4 is a cross section of an example integrated circuit including a damascene copper interconnect having a lower graphene layer and an upper graphene layer, according to an embodiment of the invention.

FIG. 4 is a cross section of an example integrated circuit including a damascene copper interconnect having a lower graphene layer and an upper graphene layer, according to an embodiment of the invention. The integrated circuit 400 includes a substrate 402 and an interconnect region 404 disposed over the substrate 402. The substrate 402 includes a semiconductor material 406. Active components 408, shown in FIG. 4 disposed in doped wells 410, are disposed in the semiconductor material 406. The active components 408 may be laterally separated by field oxide 412 disposed in the substrate 402.

The interconnect region 404 of the instant example includes a PMD layer 414 disposed directly above the substrate 402 and the active components 408, a first IMD layer 416 disposed directly above the PMD layer 414, and a first ILD layer 418 disposed directly above the first IMD layer 416. Additional IMD layers and ILD layers of the integrated circuit 400, not shown in FIG. 4, extend above the first ILD layer 418. Contacts 422 are disposed through the PMD layer 414, making electrical connections to the active components 408. The PMD layer 414 and the contacts 422 may have a structure similar to that disclosed in reference to FIG. 1.

The first IMD layer 416 may include one or more sublayers of dielectric material, including an etch stop layer of silicon nitride, a main layer of low-k dielectric material and a cap layer of silicon nitride, silicon carbide, or silicon nitride-carbide. First-level interconnects 424 are disposed in interconnect trenches in the first IMD layer 416. The first-level interconnects 424 make electrical connections to tops of the contacts 422. In the instant example, the first-level interconnects 424 include a lower hBN layer 426 disposed on the PMD layer 414 and extending up sidewalls of the interconnect trenches to a top surface of the first IMD layer 416, a lower graphene layer 428 disposed directly on the lower hBN layer 426 and extending up sides of the first-level interconnects 424, a metal layer 430 disposed directly on the lower graphene layer 428, an upper graphene layer 432 disposed directly on the metal layer 430, and an upper hBN layer 434 disposed directly on the upper graphene layer 432 and extending over the first IMD layer 416 adjacent to the first-level interconnects 424. The metal layer 430 of the instant example includes a damascene liner 438 disposed on the lower graphene layer 428 and extending up sides of the first-level interconnects 424. The damascene liner 438 includes a copper diffusion barrier of tantalum nitride or such. The metal layer 430 of the instant example further includes a damascene copper layer 436 disposed on the damascene liner 438. The upper graphene layer 432 is disposed directly on the damascene copper layer 436. The lower hBN layer 426 and the upper hBN layer 434 are each one to three atomic layers thick. The lower graphene layer 428 and the upper graphene layer 432 each include one or more atomic layers of graphene, for example, one to ten layers. Dielectric material of the PMD layer 414 touches the lower hBN layer 426, opposite from the lower graphene layer 428.

The first ILD layer 418 may have a structure similar to that disclosed in reference to FIG. 1. Dielectric material of the first ILD layer 418 touches the upper hBN layer 434, opposite from the upper graphene layer 432.

Figure 5C:
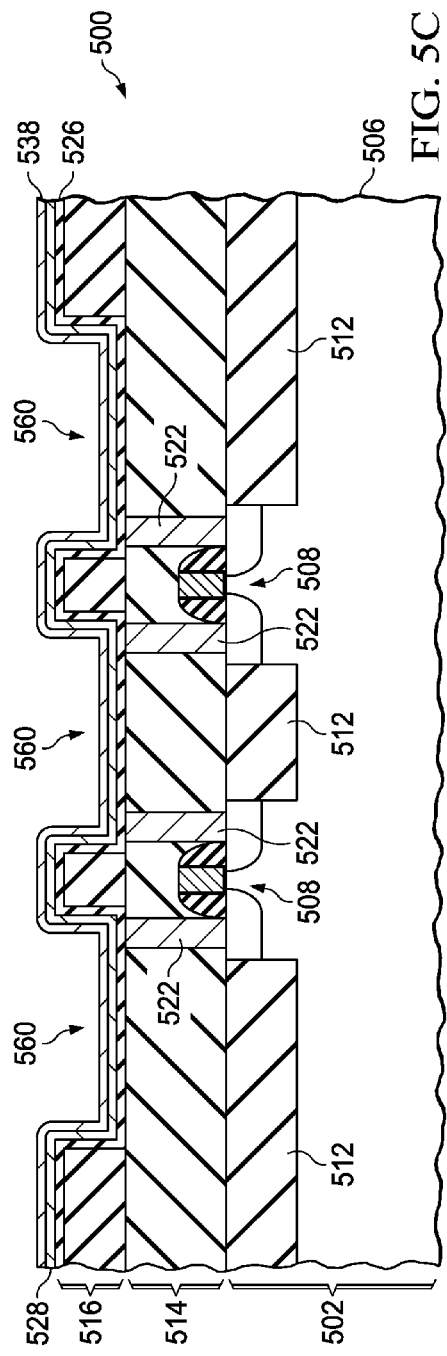

FIG. 5A through FIG. 5G are cross sections of an integrated circuit including an etched aluminum interconnect having a lower graphene layer and an upper graphene layer, depicting successive stages of formation, according to an embodiment of the invention. Referring to FIG. 5A, the integrated circuit 500 includes a substrate 502 with a semiconductor material 506. Active components 508, depicted as MOS transistors 508, are formed in the semiconductor material 506. Field oxide 512 may be formed in the substrate 502 to laterally separate the active components 508. A PMD layer 514 is formed over the substrate 502 and the active components 508. Contacts 522 are formed through the PMD layer 514, making electrical connections to the active components 508.

A first IMD layer 516 is formed over the PMD layer 514 and the contacts 522. The first IMD layer 516 may be formed, for example, by a series of PECVD processes. Interconnect trenches 560 are formed through the first IMD layer 516, exposing tops of the contacts 522. The interconnect trenches 560 may be formed by an RIE process using an etch mask.

A lower hBN layer 526 is formed over the first IMD layer 516, extending into the interconnect trenches 560 and onto the PMD layer 514 at bottoms of the interconnect trenches 560. The lower hBN layer 526 may be formed by an ALD process, by a PECVD process, or by another method. The lower hBN layer 526 is one to three atomic layers thick.

Referring to FIG. 5B, a lower graphene layer 528 is formed on the lower hBN layer 526. The lower graphene layer 528 extends into the interconnect trenches 560 and is continuous along the lower hBN layer 526 at the bottoms of the interconnect trenches 560. The lower graphene layer 528 may be formed, for example, by a PECVD process or an additive process, which may be advantageous due to the topography of the interconnect trenches 560.

Referring to FIG. 5C, a damascene liner 538 is formed on the lower graphene layer 528. The damascene liner 538 may include, for example, tantalum nitride. The damascene liner 538 may be formed by an ALD process to provide continuous coverage in the interconnect trenches 560.

Figure 5D:
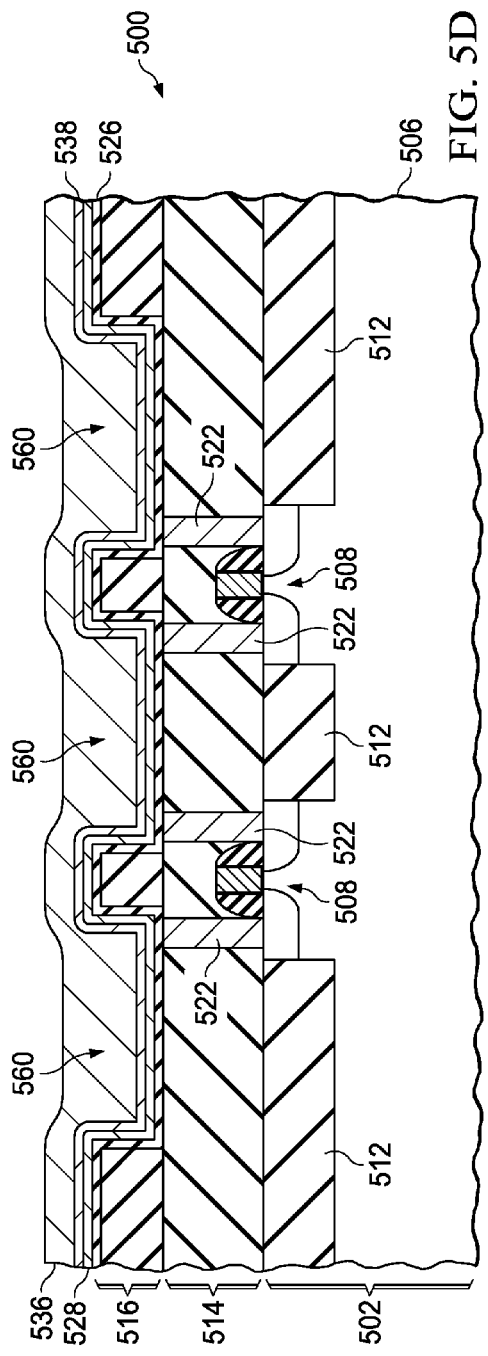

Referring to FIG. 5D, a damascene copper layer 536 is formed on the damascene liner 538, filling the interconnect trenches 560. The damascene copper layer 536 may be formed, for example, by forming a seed layer of copper, not shown in FIG. 5D, directly on the damascene liner 538 by a sputter process, and subsequently forming a remainder of the damascene copper layer 536 on the seed layer by an electroplating process. The electroplating process may use a combination of brighteners, inhibitors and levelers, which are additives to the electroplating bath, to fill the interconnect trenches 560 with the damascene copper layer 536 while minimizing a thickness of the electroplated copper over the first IMD layer 516 adjacent to the interconnect trenches 560.

Figure 5E:
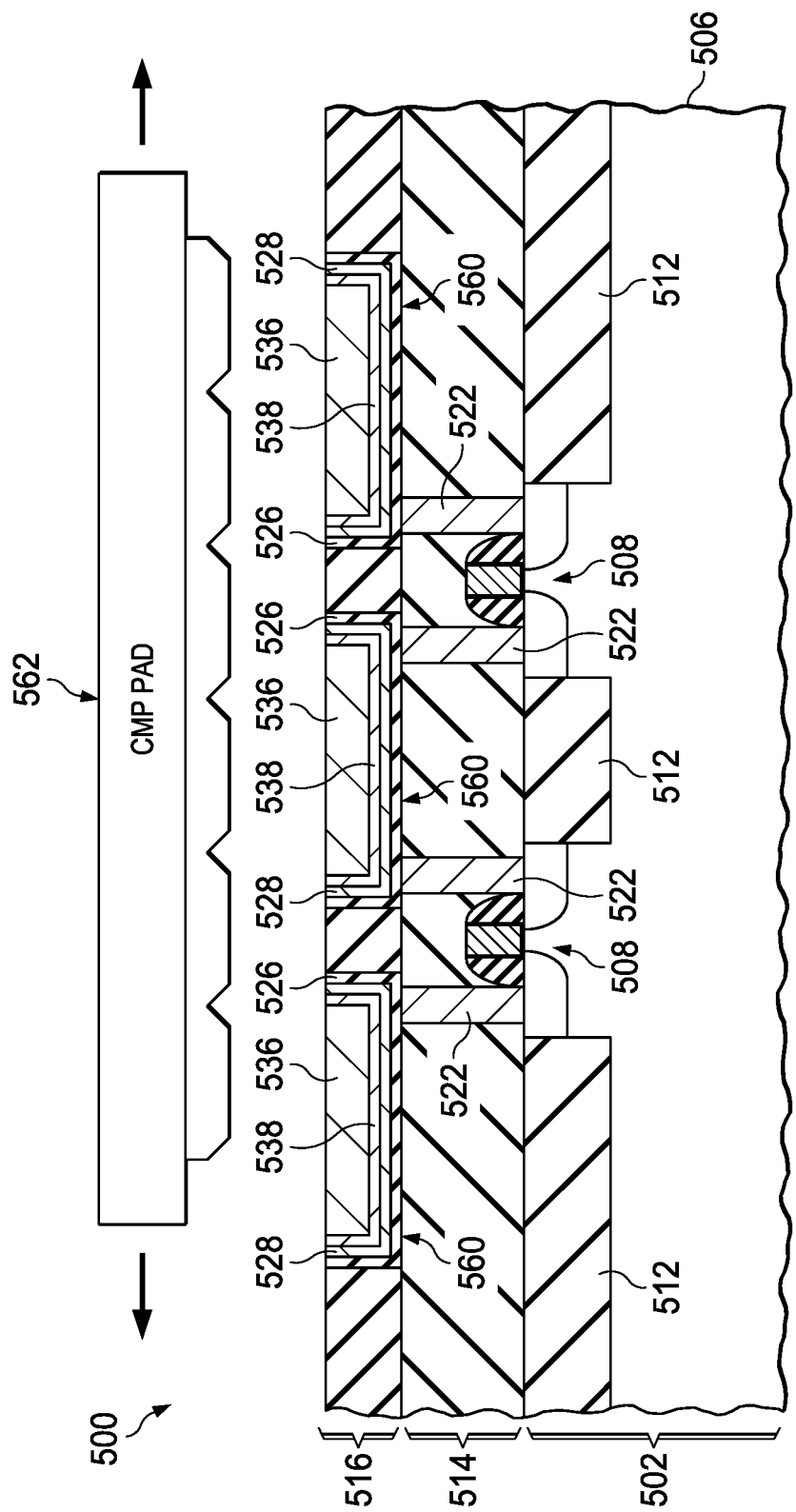

Referring to FIG. 5E, the damascene copper layer 536, the damascene liner 538, the lower graphene layer 528 and the lower hBN layer 526 are removed from over the first IMD layer 516 by a copper CMP process, depicted schematically in FIG. 5E by the copper CMP pad 562. The damascene copper layer 536, the damascene liner 538, the lower graphene layer 528 and the lower hBN layer 526 are left in place in the interconnect trenches 560.

Figure 5F:
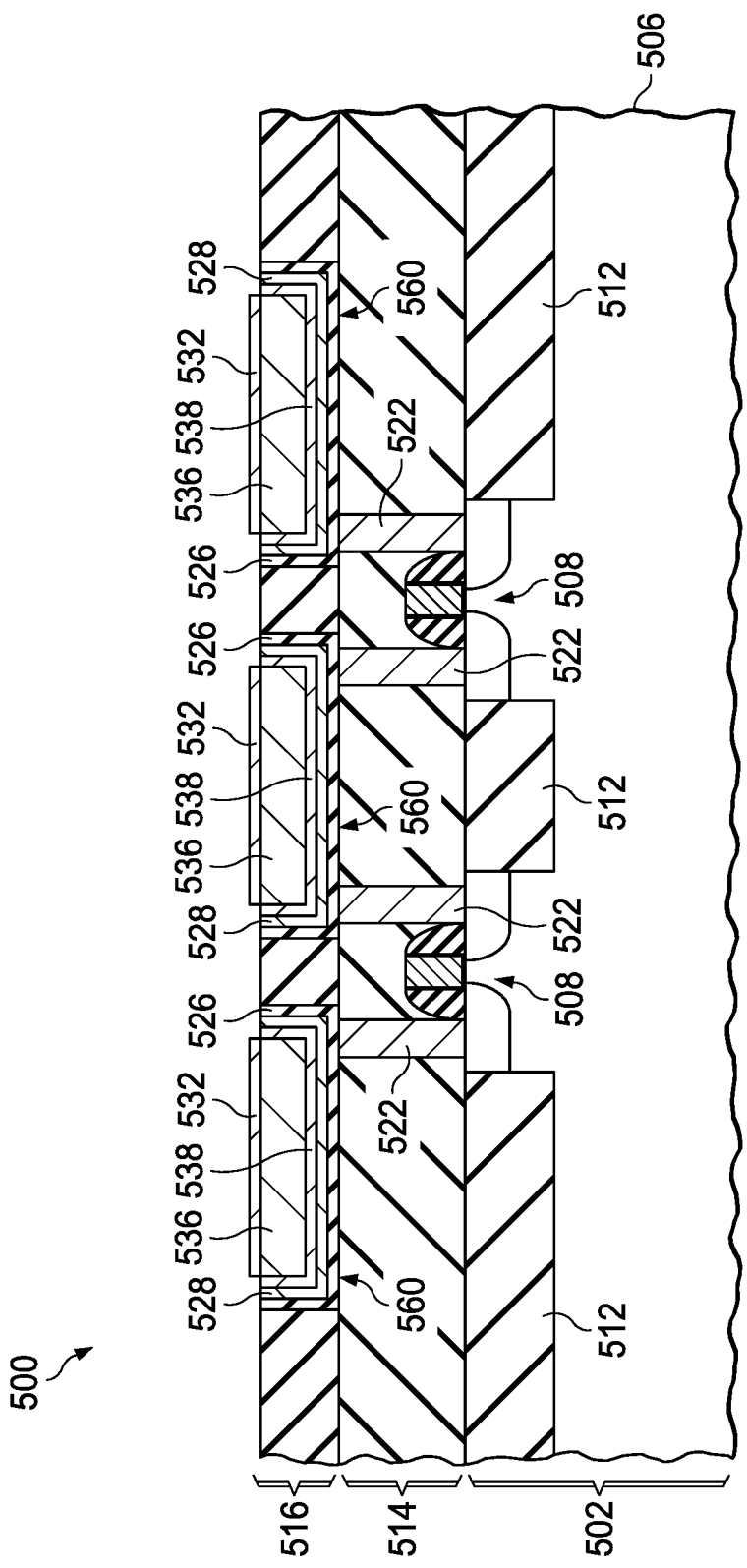

Referring to FIG. 5F, an upper graphene layer 532 is formed on the damascene copper layer 536. The upper graphene layer 532 includes one or more atomic layers of graphene, and does not extend onto the first IMD layer 516 adjacent to the interconnect trenches 560. The upper graphene layer 532 may be formed, for example, by a PECVD process in which the damascene copper layer 536 catalyzes formation of graphene selectively, in a manner similar to the PECVD process described in reference to FIG. 2F. Alternatively, the upper graphene layer 532 may be formed by an additive process, for example as described in reference to FIG. 3B. Other methods of forming the upper graphene layer 532 are within the scope of the instant example.

Figure 5G:
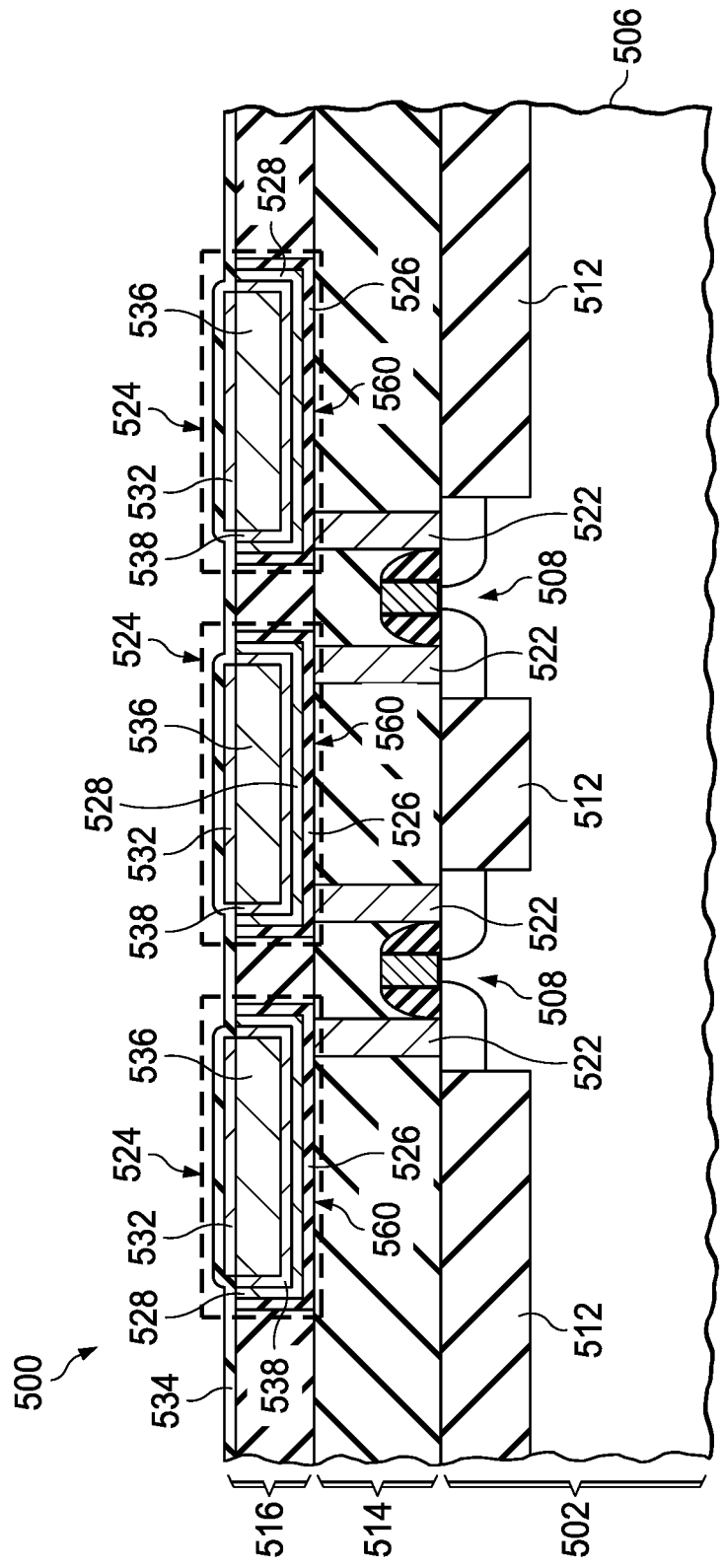

Referring to FIG. 5G, an upper hBN layer 534 is formed on an existing top surface of the integrated circuit 500, including the upper graphene layer 532. The upper hBN layer 534 may be formed by an ALD process, a PECVD process, or other method. A combination of the lower hBN layer 526, the lower graphene layer 528, the damascene liner 538 the damascene copper layer 536, the upper graphene layer 532 and the upper hBN layer 534 provide the first-level interconnects 524 of the integrated circuit 500. Formation of the integrated circuit 500 continues with formation of a first ILD layer, not shown in FIG. 5G, on the upper hBN layer 534. Dielectric material of the first ILD layer touches the upper hBN layer 534.

Figure 6:
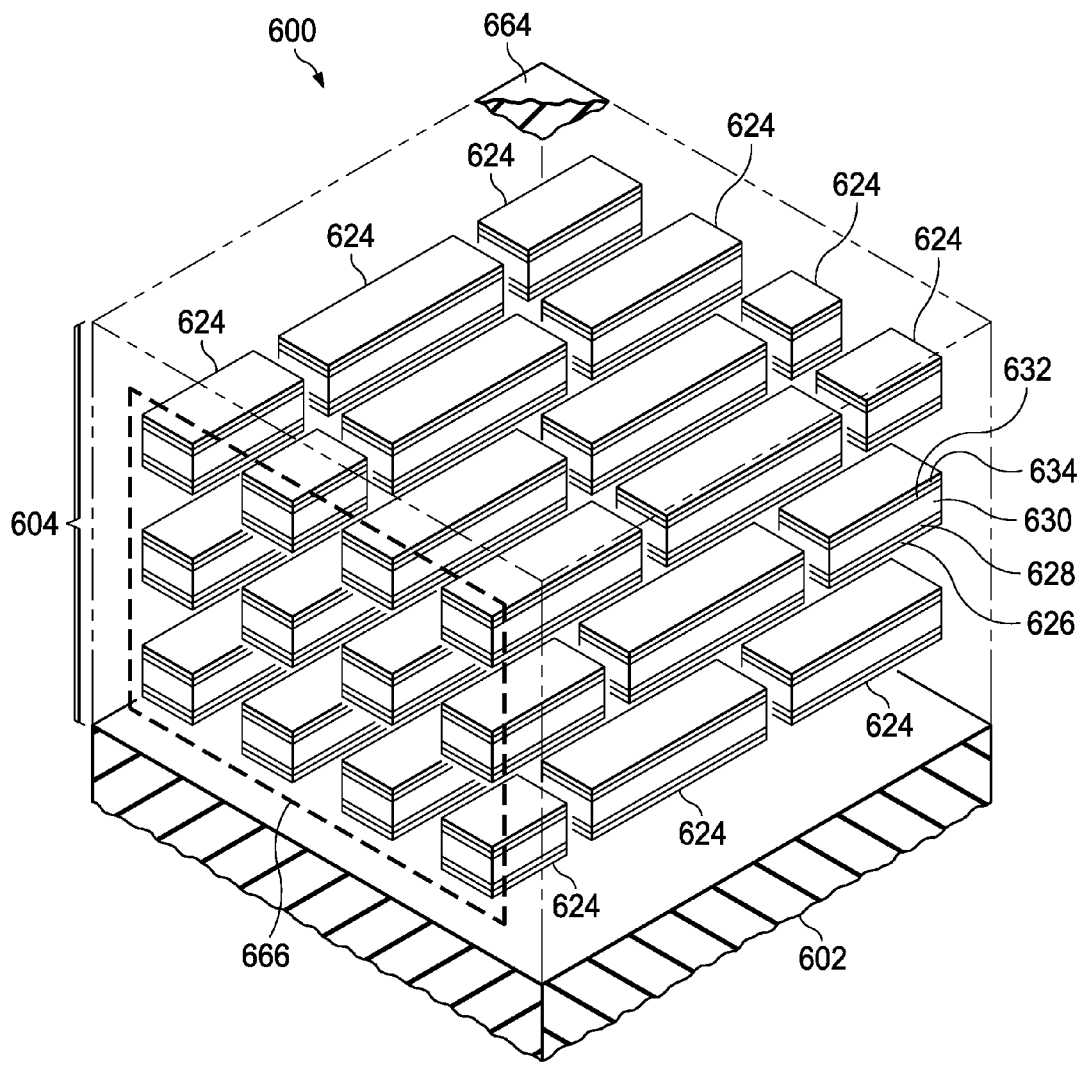
FIG. 6 is a cross section of an example integrated circuit including a Litz wire including a metal interconnect including a plurality of segments, each with a lower graphene layer and an upper graphene layer, according to an embodiment of the invention.

FIG. 6 is a cross section of an example integrated circuit including a Litz wire including a metal interconnect including a plurality of segments, each with a lower graphene layer and an upper graphene layer, according to an embodiment of the invention. The integrated circuit 600 includes a substrate 602 and an interconnect region 604 disposed over the substrate 602. The substrate 602 includes a semiconductor material and active components, for example as described in reference to FIG. 1. The interconnect region 604 includes dielectric material 664, for example a stack of dielectric layers as described in reference to FIG. 1. In the instant example, the integrated circuit 600 includes a Litz wire 666 which includes a plurality of strands of serially-connected interconnect segments 624. In the instant example, each interconnect segment 624 has a metal layer 630, a lower graphene layer 628 on a bottom surface of the metal layer 630, a lower hBN layer 626 on the lower graphene layer 628 opposite from the metal layer 630, an upper graphene layer 632 on a top surface of the metal layer 630, and an upper hBN layer 634 on the upper graphene layer 632 opposite from the metal layer 630. The dielectric material 664 contacts the lower hBN layer 626 opposite from the lower graphene layer 628, and contacts the upper hBN layer 634 opposite from the upper graphene layer 632. In other versions of the instant example, some of the interconnect segments 624 may have the lower graphene layer 628 and the lower hBN layer 626, without the upper graphene layer 632. In other versions of the instant example, some of the interconnect segments 624 may have the upper graphene layer 632 and upper hBN layer 634, without the lower graphene layer 628. The interconnect segments 624 of the Litz wire 666 are disposed in a plurality of interconnect levels; in the instant example, the Litz wire 666 includes three interconnect levels of the interconnect segments 624. Connections between sequential interconnect segments 624 in each strand are not shown in FIG. 6, to more clearly show the arrangement of the interconnect segments 624 themselves. Each strand is configured so that a portion of the interconnect segments 624 in that strand are located at a periphery of the Litz wire 666. The sequential interconnect segments 624 in each strand may be connected, for example, by vias and other interconnects. Each strand includes a portion of the interconnect segments 624 in each interconnect level. The Litz wire 666 may advantageously exhibit lower impedance at high frequency, due to distribution of the skin effect among the interconnect segments 624, as compared to a monolithic conductor with a similar nominal cross section area. Each strand is isolated from the other strands by the dielectric material 664, advantageously reducing induced local currents, sometimes referred to as the "proximity effect."

Figure 7:
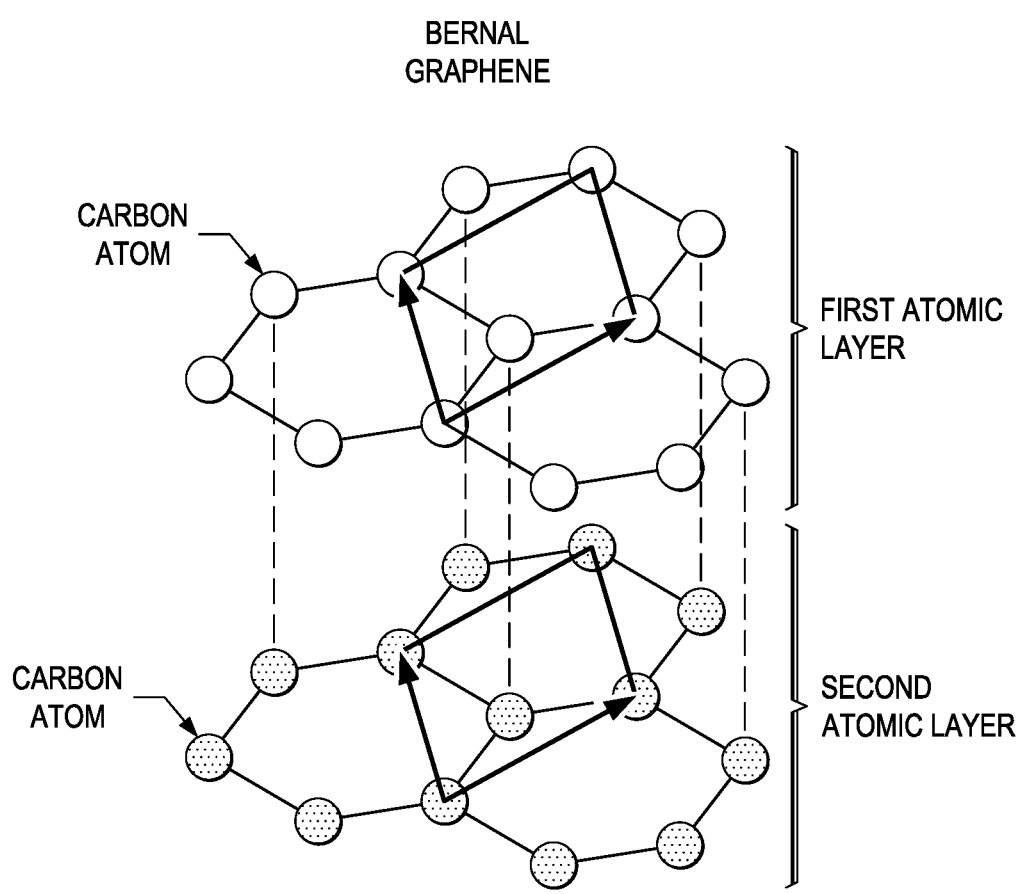
FIG. 7 is a perspective view of Bernal graphene.

FIG. 7 is a perspective view of Bernal graphene. The layers of graphene in the examples disclosed herein may include Bernal graphene. A first atomic layer of graphene, designated FIRST ATOMIC LAYER in FIG. 7, contains carbon atoms, designated CARBON ATOM in FIG. 7, in a hexagonal configuration. A second atomic layer of graphene, designated SECOND ATOMIC LAYER in FIG. 7, also contains carbon atoms in a hexagonal configuration. Half of the carbon atoms in the first atomic layer are located directly over carbon atoms in the second atomic layer. Additional layers of graphene have similar alignments with respect to immediately underlying graphene layers. Including Bernal graphene in the graphene layers of the graphene heterolayers may advantageously improve electrical conductivity of the graphene heterolayers compared to layers of graphene having other configurations.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate including a semiconductor material;
   active components disposed in the substrate;
   an interconnect region disposed over the substrate, the interconnect region including a dielectric material; and
   an interconnect disposed in the interconnect region, the interconnect comprising:
      a metal layer;
      a graphene layer disposed on one of a top surface of the metal layer or a bottom surface of the metal layer, the graphene layer having at least one atomic layer of graphene; and
      a hexagonal boron nitride (hBN) layer disposed on the graphene layer opposite from the metal layer, the hBN layer being one to three atomic layers thick, wherein the dielectric material touches the hBN layer opposite from the graphene layer.

2. The integrated circuit of claim 1, wherein:
   the graphene layer is a lower graphene layer disposed on the bottom surface of the metal layer;
   the hBN layer is a lower hBN layer disposed on the lower graphene layer;
   the dielectric material is a first dielectric material;
   the interconnect region includes a second dielectric material, separate from the first dielectric material; and
   the interconnect further comprises:
      an upper graphene layer disposed on the top surface of the metal layer, the upper graphene layer having at least one atomic layer of graphene; and
      an upper hBN layer disposed on the upper graphene layer, opposite from the metal layer, the upper graphene being one to three atomic layers thick, wherein the second dielectric material touches the upper hBN layer opposite from the upper graphene layer.

3. The integrated circuit of claim 1, wherein the graphene layer includes Bernal graphene.

4. The integrated circuit of claim 1, wherein the metal layer includes an aluminum layer comprising primarily aluminum, and wherein the graphene layer does not extend onto lateral surfaces of the aluminum layer.

5. The integrated circuit of claim 1, wherein the metal layer includes a damascene copper layer disposed on a damascene liner.

6. A method of forming an integrated circuit, comprising:
providing a substrate comprising a semiconductor material;
forming active components in the semiconductor material;
forming a lower dielectric layer over the substrate; and
forming an interconnect, comprising:
 forming a lower hBN layer on the lower dielectric layer, the lower hBN layer being one to three atomic layers thick;
 forming a lower graphene layer on the lower hBN layer, the lower graphene layer having at least one atomic layer of graphene; and
 forming a metal layer on the lower graphene layer.

7. The method of claim 6, wherein forming the lower hBN layer includes an atomic layer deposition (ALD) process, comprising:
flowing a boron-containing reagent gas over the lower dielectric layer to form a boron-containing layer on the lower dielectric layer;
ceasing flow of the boron-containing reagent gas;
flowing a nitrogen-containing reagent gas over the lower dielectric layer, wherein nitrogen from the nitrogen-containing reagent gas reacts with the boron-containing layer to form an atomic layer of boron nitride of the lower hBN layer; and
ceasing flow of the nitrogen-containing reagent gas.

8. The method of claim 6, wherein forming the lower hBN layer includes a plasma enhanced chemical vapor deposition (PECVD) process, comprising:
concurrently flowing a boron-containing reagent gas and a nitrogen-containing reagent gas over the lower dielectric layer; and
applying radio-frequency (RF) power to the boron-containing reagent gas and the nitrogen-containing reagent gas.

9. The method of claim 6, wherein forming the lower graphene layer includes a PECVD process, comprising:
flowing a carbon-containing reagent gas over the lower hBN layer; and
applying RF power to the carbon-containing reagent gas.

10. The method of claim 6, wherein forming the lower graphene layer includes a transfer process, comprising:
forming the lower graphene layer on a growth substrate separate from the integrated circuit;
removing the lower graphene layer from the growth substrate; and
disposing the lower graphene layer on the lower hBN layer.

11. The method of claim 6, wherein forming the metal layer comprises:
forming an aluminum layer comprising primarily aluminum over the lower graphene layer by a sputter process;
forming an etch mask over the aluminum layer, the etch mask covering an area for the interconnect;
removing the aluminum layer and the lower graphene layer where exposed by the etch mask; and
subsequently removing the etch mask.

12. The method of claim 6, wherein forming the metal layer comprises:
forming a damascene liner on the lower graphene layer, wherein the lower graphene layer and the lower hBN layer are disposed in an interconnect trench in the lower dielectric layer;
forming a damascene copper layer on the damascene liner; and
removing the damascene copper layer, the damascene liner, the lower graphene layer and the lower hBN layer from over the lower dielectric layer adjacent to the interconnect trench.

13. A method of forming an integrated circuit, comprising:
providing a substrate comprising a semiconductor material;
forming active components in the semiconductor material;
forming a lower dielectric layer over the substrate; and
forming an interconnect, comprising:
 forming a metal layer above the lower dielectric layer;
 forming an upper graphene layer on the metal layer, the upper graphene layer having at least one atomic layer of graphene;
 forming an upper hBN layer on the upper graphene layer, the upper hBN layer being one to three atomic layers thick; and
 forming an upper dielectric layer on the upper hBN layer.

14. The method of claim 13, wherein forming the upper graphene layer includes a PECVD process, comprising:
flowing a carbon-containing reagent gas over the metal layer; and
applying RF power to the carbon-containing reagent gas.

15. The method of claim 14, wherein the metal layer includes a catalyst, and the upper graphene layer is formed selectively on the metal layer.

16. The method of claim 13, wherein forming the upper graphene layer includes a transfer process, comprising:
forming the upper graphene layer on a growth substrate separate from the integrated circuit;
removing the upper graphene layer from the growth substrate; and
disposing the upper graphene layer on the metal layer.

17. The method of claim 13, wherein forming the upper hBN layer includes an ALD process, comprising:
flowing a boron-containing reagent gas over the upper graphene layer to form a boron-containing layer on the upper graphene layer;
ceasing flow of the boron-containing reagent gas;
flowing a nitrogen-containing reagent gas over the upper graphene layer, wherein nitrogen from the nitrogen-containing reagent gas reacts with the boron-containing layer to form an atomic layer of boron nitride of the upper hBN layer; and
ceasing flow of the nitrogen-containing reagent gas.

18. The method of claim 13, wherein forming the lower hBN layer includes a PECVD process, comprising:
concurrently flowing a boron-containing reagent gas and a nitrogen-containing reagent gas over the upper graphene layer; and
applying RF power to the boron-containing reagent gas and the nitrogen-containing reagent gas.

19. The method of claim 13, wherein forming the metal layer comprises:
forming an aluminum layer comprising primarily aluminum above the lower dielectric layer by a sputter process;
forming an etch mask over the upper hBN layer, the etch mask covering an area for the interconnect;
removing the upper hBN layer, the upper graphene layer, and the aluminum layer where exposed by the etch mask; and
subsequently removing the etch mask.

20. The method of claim 13, wherein forming the metal layer comprises:
  forming a damascene liner on the lower dielectric layer, the damascene liner extending into an interconnect trench in the lower dielectric layer;
  forming a damascene copper layer on the damascene liner; and
  removing the damascene copper layer and the damascene liner from over the lower dielectric layer adjacent to the interconnect trench, wherein the upper graphene layer is formed after removing the damascene copper layer and the damascene liner from over the lower dielectric layer adjacent to the interconnect trench.

* * * * *